(12) United States Patent
Ahn et al.

(10) Patent No.: US 11,342,207 B2
(45) Date of Patent: May 24, 2022

(54) MICRO LED TRANSFER HEAD

(71) Applicant: POINT ENGINEERING CO., LTD., Asan (KR)

(72) Inventors: Bum Mo Ahn, Suwon (KR); Seung Ho Park, Hwaseong (KR); Sung Hyun Byun, Hwaseong (KR)

(73) Assignee: POINT ENGINEERING CO., LTD., Asan (KR)

( * ) Notice: Subject to any disclaimer, the term of this patent is extended or adjusted under 35 U.S.C. 154(b) by 123 days.

(21) Appl. No.: 16/989,431

(22) Filed: Aug. 10, 2020

(65) Prior Publication Data
US 2021/0050236 A1 Feb. 18, 2021

(30) Foreign Application Priority Data

Aug. 14, 2019 (KR) .................. 10-2019-0099707

(51) Int. Cl.
*H01L 21/67* (2006.01)
*B65G 47/91* (2006.01)
*H01L 21/683* (2006.01)
*H01L 25/16* (2006.01)

(52) U.S. Cl.
CPC ........ *H01L 21/67144* (2013.01); *B65G 47/91* (2013.01); *H01L 21/6838* (2013.01); *H01L 25/167* (2013.01)

(58) Field of Classification Search
None
See application file for complete search history.

(56) References Cited

FOREIGN PATENT DOCUMENTS

| KR | 100731673 B1 | 6/2007 |
| KR | 20140112486 A | 9/2014 |
| KR | 20170019415 A | 2/2017 |
| KR | 20170024906 A | 3/2017 |
| KR | 20170026959 A | 3/2017 |
| KR | 101754528 B1 | 7/2017 |
| KR | 101757404 B1 | 7/2017 |

*Primary Examiner* — Ronald P Jarrett

(57) ABSTRACT

A micro LED transfer head is proposed. The micro LED transfer head includes: a holding member including a holding region that holds a micro LED by means of vacuum holding force and a non-holding region that does not hold the micro LED; and a porous member provided on top of the holding member and having arbitrary pores, wherein the holding region includes: a first holding region; and a second holding region provided above the first holding region, formed to have a larger opening area than the first holding region, and communicating with the first holding region and the porous member, whereby the micro LED transfer head selectively transfers the micro LED.

8 Claims, 16 Drawing Sheets

MICRO LED TRANSFER HEAD

CROSS REFERENCE TO RELATED APPLICATION

The present application claims priority to Korean Patent Application No. 10-2019-0099707, filed Aug. 14, 2019, the entire contents of which is incorporated herein for all purposes by this reference.

BACKGROUND OF THE INVENTION

Field of the Invention

The present invention relates to a micro LED transfer head configured such that crystalline particles of a porous member do not interfere with transfer of a micro light-emitting diode (micro LED).

Description of the Related Art

Currently, the display market remains dominated by LCDs, but OLEDs are quickly replacing LCDs and emerging as mainstream products. In the current situation in which display makers are rushing to participate in the OLED market, micro light-emitting diode (hereinafter, referred to as micro LED) displays have emerged as another type of next generation display. Liquid crystal and organic materials are the core materials of LCDs and OLEDs, respectively, whereas the micro LED display uses LED chips having a size of 1 to 100 micrometers (μm) as a light emitting material.

Since the term "micro LED" emerged in the patent "MICRO-LED ARRAYS WITH ENHANCED LIGHT EXTRACTION" in 1999 (Korean Patent No. 10-0731673, hereinafter referred to as 'Related Art 1') disclosed by Cree Inc., related research papers based thereon were subsequently published. In order to apply micro LEDs to a display, it is necessary to develop a customized microchip based on a flexible material and/or a flexible device using a micro LED device, and techniques of transferring micrometer-sized LED chips and accurately mounting the LED chips on a display pixel electrode are required.

Particularly, with regard to the transfer of the micro LED device to a display substrate, as the LED size is reduced to 1 to 100 micrometers (μm), it is impossible to use a conventional pick-and-place machine, and a technology of a transfer head for higher precision is required.

Therefore, instead of using a conventional method using vacuum holding force, techniques that use various forces such as electrostatic force, Van der Waals force, and magnetic force are being developed. Examples of thereof include transfer techniques that use materials having a bonding force that is variable by heat, laser, UV, electromagnetic waves, and the like, methods that use rollers, and methods using fluids.

With respect to such a technology of a transfer head, several structures have been proposed as described below, but each of the proposed techniques has some problems.

Luxvue Technology Corp., USA, proposed a method of transferring a micro LED using an electrostatic head (Korean Patent Application Publication No. 10-2014-0112486, hereinafter referred to as 'Related Art 2'). A transfer principle of Related Art Document 2 is that a voltage is applied to a head unit made of a silicone material so that the head unit comes into close contact with a micro LED due to electrification. However, this method may cause damage to micro LEDs due to electrification caused by the voltage applied to the head unit during induction of static electricity.

X-Celeprint Limited, USA, proposed a method of using an elastic polymer material as a transfer head and transferring micro LEDs positioned on a wafer to a desired substrate (Korean Patent Application Publication No. 10-2017-0019415, hereinafter referred to as 'Patent Document 3'). According to Patent Document 3, there is no damage to micro LEDs as compared with the above-mentioned electrostatic head. However, adhesive force of the elastic transfer head is required to be higher than that of a target substrate in the transfer process to transfer micro LEDs stably, and an additional process for forming an electrode is required. In addition, maintaining adhesive force of the elastic polymer material is an important factor.

Korea Photonics Technology Institute proposed a method of transferring a micro LED using a ciliary adhesive-structured head (Korean Patent No. 10-1754528, hereinafter referred to as 'Related Art 4'). However, in Related Art Document 4, it is difficult to manufacture a ciliary adhesive structure.

Korea Institute of Machinery and Materials has proposed a method of transferring a micro LED using a roller coated with an adhesive (Korean Patent No. 10-1757404, hereinafter referred to as 'Patent Document 5'). However, Related Art Document 5 has a problem in that continuous use of the adhesive is required, and the micro LED may be damaged when pressed with the roller.

Samsung Display Co., Ltd proposed a method of transferring micro LEDs to an array substrate according to electrostatic induction by applying a negative voltage to first and second electrodes of the array substrate in a state in which the array substrate is immersed in a solution (Korean Patent Application Publication No. 10-2017-0026959, hereinafter referred to as 'Patent Document 6'). However, Related Art Document 6 has a problem in that a solution is required since the micro LED is immersed in the solution to transfer to the array substrate, and a drying process is required.

LG Electronics Inc. proposed a method in which a head holder is disposed between multiple pick-up heads and a substrate and a shape of the head holder is deformed by movement of the multiple pick-up heads such that the multiple pick-up heads are allowed to move freely (Korean Patent Application Publication No. 10-2017-0024906, hereinafter referred to as 'Patent Document 7'). However, Related Art Document 7 has a problem in that a process of applying a bonding material to the pick-up heads is required because the bonding material having adhesive force is required to be applied to bonding surfaces of the multiple pick-up heads to transfer the micro LED.

In order to solve the problems of the related art described above, it is necessary to solve the above-mentioned problems while adopting the basic principles adopted in the related art. However, there is a limit to solving the problems because such problems are derived from the basic principles adopted in related art. Therefore, applicants of the present invention have not only solved the problems of the related art but also proposed an advanced method which has not been considered in the related art.

The foregoing is intended merely to aid in the understanding of the background of the present invention, and is not intended to mean that the present invention falls within the purview of the related art that is already known to those skilled in the art.

DOCUMENTS OF RELATED ART (Patent Document 1) Korean Patent No. 10-0731673;
(Patent Document 2) Korean Patent Application Publication No. 10-2014-0112486;
(Patent Document 3) Korean Patent Application Publication No. 10-2017-0019415;
(Patent Document 4) Korean Patent No. 10-1754528;
(Patent Document 5) Korean Patent No. 10-1757404;
(Patent Document 6) Korean Patent Application Publication No. 10-2017-0026959; and
(Patent Document 7) Korean Patent Application Publication No. 10-2017-0024906

SUMMARY OF THE INVENTION

Accordingly, the present invention has been made keeping in mind the above problems occurring in the related art, and an objective of the present invention is to provide a micro LED transfer head configured such that crystalline particles of a porous member do not interfere with transfer of a micro LED.

In order to achieve the above objective, according to an aspect of the present invention, there is provided a micro LED transfer head, including: a holding member including a holding region that holds a micro LED by means of vacuum holding force and a non-holding region that does not hold the micro LED; and a porous member provided on top of the holding member and having arbitrary pores, wherein the holding region may include: a first holding region; and a second holding region provided above the first holding region, formed to have a larger opening area than the first holding region, and communicating with the first holding region and the porous member, whereby the micro LED transfer head may selectively transfer the micro LED.

The micro LED transfer head may further include a coupling member provided between the holding member and the porous member, and provided on a top surface of the non-holding region, wherein the second holding region may include a plurality of second holding regions formed in the coupling member.

Further, the holding member may be made of an anodic oxide film having vertical pores, and the first holding region may be provided by each of the vertical pores formed such that top and bottom ends of the vertical pore are open by removing a barrier layer formed during production of the anodic oxide film.

Further, the holding member may be made of an anodic oxide film having vertical pores, and the first holding region may be provided by a through-hole formed such that top and bottom ends thereof are open, and having a larger width than each of the vertical pores formed during production of the anodic oxide film.

Further, the holding member may be made of an anodic oxide film having vertical pores, and the second holding region may be formed by removing a part of a barrier layer formed during production of the anodic oxide film.

According to another aspect of the present invention, there is provided a micro LED transfer head, including: a holding member including a holding region that holds a micro LED by means of vacuum holding force and a non-holding region that does not hold the micro LED; and a porous member provided on top of the holding member and having arbitrary pores, wherein the holding member may include: a first holding member; and a second holding member provided on top of the first holding member and coupled to the porous member, wherein a first coupling member may be coupled to top of the first holding member such that corresponding holes thereof are coaxially aligned with each other, a second coupling member may be coupled to bottom of the second holding member coupling member such that corresponding holes thereof are coaxially aligned with each other, and the first holding member and the second holding member may be coupled to each other such that corresponding holes thereof are coaxially aligned with each other; and a first holding region may be formed in the first holding member and the first coupling member, and a second holding region may be formed in the second holding member and the second coupling member.

Further, the first holding region formed in the first holding member and the first coupling member may include a plurality of first holding regions that are formed independently of each other, and the second holding region formed in the second holding member and the second coupling member may include a plurality of second holding regions that are formed such that at least parts thereof communicate with each other.

Further, the second holding region may have a larger opening area than the first holding region, and the second holding region may communicate with the porous member.

As described above, in the micro LED transfer head according to the present invention, the crystal particles of the porous member do not interfere with transfer of the micro LED, which makes it possible to facilitate transfer of the micro LED.

BRIEF DESCRIPTION OF THE DRAWINGS

The above and other objectives, features, and other advantages of the present invention will be more clearly understood from the following detailed description when taken in conjunction with the accompanying drawings, in which.

DETAILED DESCRIPTION OF THE INVENTION

Figure 1:
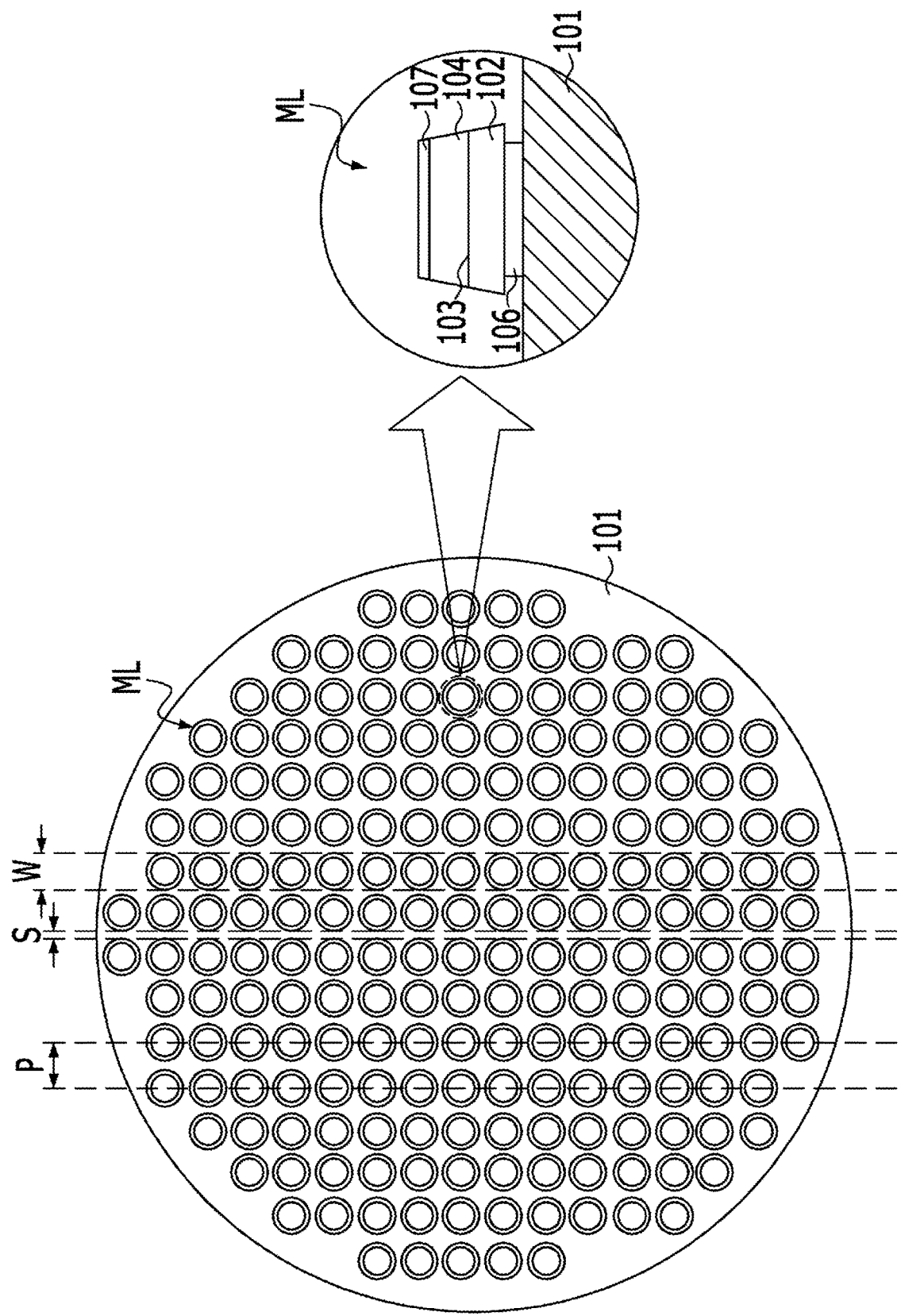
FIG. 1 is a view illustrating a plurality of micro LEDs to be transferred by a micro LED transfer head according to an embodiment of the present invention.

Contents of the description below merely exemplify the principle of the invention. Therefore, those of ordinary skill in the art may implement the theory of the invention and invent various apparatuses which are included within the concept and the scope of the invention even though it is not clearly explained or illustrated in the description. Furthermore, in principle, all the conditional terms and embodiments listed in this description are clearly intended for the purpose of understanding the concept of the invention, and one should understand that this invention is not limited the exemplary embodiments and the conditions.

The above described objectives, features, and advantages will be more apparent through the following detailed description related to the accompanying drawings, and thus those of ordinary skill in the art may easily implement the technical spirit of the invention.

The embodiments of the present invention will be described with reference to cross-sectional views and/or perspective views which schematically illustrate ideal embodiments of the present invention.

For explicit and convenient description of the technical content, sizes or thicknesses of films and regions and diameters of holes in the figures may be exaggerated. Therefore, variations from the shapes of the illustrations as a result, for example, of manufacturing techniques and/or tolerances, are to be expected. In addition, a limited number of micro LEDs are illustrated in the drawings. Thus, the embodiments should not be construed as limited to the particular shapes of regions illustrated herein but are to include deviations in shapes that result, for example, from manufacturing.

Wherever possible, the same reference numerals will be used throughout different embodiments and the description to refer to the same or like elements or parts. In addition, the configuration and operation already described in other embodiments will be omitted for convenience.

Hereinafter, prior to describing exemplary embodiments of the present invention with reference to the accompanying drawings, a micro device may include a micro LED. The micro LED is not a package type covered with a molding resin or the like but a piece obtained by cutting out a wafer used for crystal growth, and technically refers to one having a size of 1 to 100 μm. However, the micro LED described herein is not limited to one having a size (length of one side) of 1 to 100 μm, and includes one having a size of equal to or greater than 100 μm or a size of less than 1 μm.

Further, the configurations of the exemplary embodiments of the present invention described below can also be applied to transfer of micro devices that can be applied without changing the technical spirit of each embodiment.

A micro LED holding body according to the present invention may hold micro LEDs by means of vacuum holding force. The micro LED holding body is not limited in terms of the structure thereof, as long as the structure is capable of generating a vacuum.

The micro LED holding body may be a carrier substrate that receives a micro LED ML from a growth substrate 101 or a temporary substrate, or a micro LED transfer head that holds the micro LED ML of a first substrate, such as the growth substrate 101 or the temporary substrate, and transfers the micro LED ML to a second substrate, such as the temporary substrate or a display substrate 301.

Hereinafter, as the micro LED holding body capable of holding the micro LEDs MLs by means of vacuum holding force, the micro LED transfer head 1 will be described as an example.

First, referring to FIG. 1, a micro LED ML serving as a transfer target of the micro LED transfer head 1 according to the present invention will be described.

FIG. 1 is a view illustrating a plurality of micro LEDs MLs to be transferred by the micro LED transfer head 1 according to an embodiment of the present invention. The micro LEDs MLs are fabricated and disposed on the growth substrate 101.

The growth substrate 101 may be embodied by a conductive substrate or an insulating substrate. For example, the growth substrate 101 may be made of at least one selected from among the group consisting of sapphire, SiC, Si, GaAs, GaN, ZnO, GaP, InP, Ge, and $Ga_2O_3$.

Each of the micro LEDs MLs may include: a first semiconductor layer 102; a second semiconductor layer 104; an active layer 103 provided between the first semiconductor layer 102 and the second semiconductor layer 104; a first contact electrode 106; and a second contact electrode 107.

The first semiconductor layer 102, the active layer 103, and the second semiconductor layer 104 may be formed by performing metalorganic chemical vapor deposition (MOCVD), chemical vapor deposition (CVD), plasma-enhanced chemical vapor deposition (PECVD), molecular-beam epitaxy (MBE), hydride vapor phase epitaxy (HVPE), or the like.

The first semiconductor layer 102 may be implemented, for example, as a p-type semiconductor layer. A p-type semiconductor layer may be made of a semiconductor material having a composition formula of $In_xAl_yGa_{1-x-y}N$ ($0 \leq x \leq 1$, $0 \leq y \leq 1$, $0 \leq x+y \leq 1$) selected from among, for example, GaN, AlN, AlGaN, InGaN, InN, InAlGaN, AlInN, and the like, and the layer may be doped with a p-type dopant such as Mg, Zn, Ca, Sr, or Ba.

The second semiconductor layer 104 may be implemented, for example, as an n-type semiconductor layer. An n-type semiconductor layer may be made of a semiconductor material having a composition formula of $In_xAl_yGa_{1-x-y}N$ ($0 \leq x \leq 1$, $0 \leq y \leq 1$, $0 \leq x+y \leq 1$) selected from among, for example, GaN, AlN, AlGaN, InGaN, InN, InAlGaN, AlInN, and the like, and the layer may be doped with an n-type dopant such as Si, Ge, or Sn.

However, the present invention is not limited thereto. For example, the first semiconductor layer 102 may be implemented as an n-type semiconductor layer, and the second semiconductor layer 104 may be implemented as a p-type semiconductor layer.

The active layer 103 is a region where electrons and holes are recombined. As the electrons and the holes are recombined, the active layer 103 transits to a low energy level and generates light having a wavelength corresponding thereto. The active layer 103 may be made of a semiconductor material having a composition formula of $In_xAl_yGa_{1-x-y}N$ ($0 \leq x \leq 1$, $0 \leq y \leq 1$, $0 \leq x+y \leq 1$) and may have a single quantum well structure or a multi quantum well (MQW) structure. In addition, the active layer 103 may have a quantum wire structure or a quantum dot structure.

The first semiconductor layer 102 may be provided with the first contact electrode 106, and the second semiconductor layer 104 may be provided with the second contact electrode 107. The first contact electrode 106 and/or the second contact electrode 107 may include at least one layer and may be made of various conductive materials including a metal, conductive oxide, and conductive polymer.

The plurality of micro LEDs MLs formed on the growth substrate 101 may be separated into individual pieces by cutting along a cutting line using a laser or the like or by etching. Then, it is possible to separate the individual micro LEDs MLs from the growth substrate 101 by a laser lift-off process.

In FIG. 1, the letter "P" denotes a pitch distance between the micro LEDs MLs, "S" denotes a separation distance between the micro LEDs MLs, and "W" denotes a width of each micro LED ML. Although FIG. 1 illustrates that the cross-sectional shape of the micro LEDs MLs is circular, the cross-sectional shape of the micro LEDs MLs is not limited thereto. For example, depending on how the micro LEDs MLs are fabricated on the growth substrate 101, the micro LEDs MLs may have a different cross-sectional shape than a circular cross-sectional shape, such as a quadrangular cross-section shape.

Figure 2:
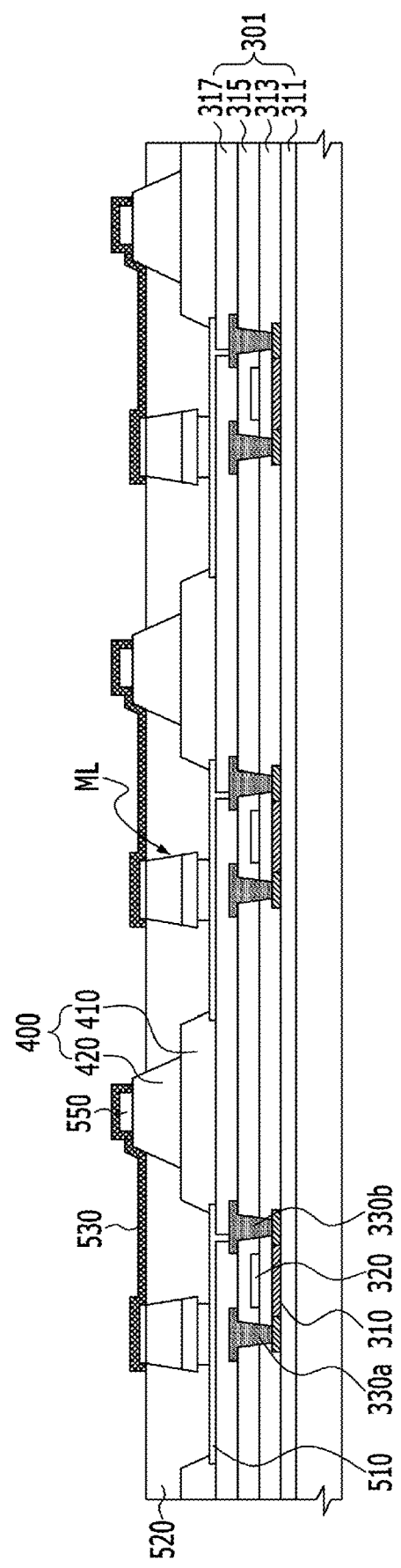
FIG. 2 is a view illustrating a micro LED structure in which the micro LEDs are transferred and mounted to a display substrate according to an embodiment of the present invention.

FIG. 2 is a view illustrating a micro LED structure in which the micro LEDs MLs are transferred and mounted to the display substrate 301 by the micro LED transfer head 1 according to the embodiment of the present invention.

Referring to FIG. 2, the display substrate 301 may include various materials. For example, the display substrate 301 is a circuit board, and may be made of a transparent glass material having $SiO_2$ as a main component. However, materials of the display substrate 301 are not limited thereto. The display substrate 301 may be made of a transparent plastic material and thus have solubility. The plastic material may be an organic substance selected from among the group consisting of organic insulating substances, including polyethersulfone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), cellulose triacetate (TAC), and cellulose acetate propionate (CAP).

In the case of a bottom emission type in which an image is implemented in a direction of the display substrate 301, the display substrate 301 is required to be made of a transparent material. However, in the case of a top emission type in which an image is implemented in a direction opposite to the display substrate 301, the display substrate 301 is not necessarily required to be made of a transparent material. In this case, the display substrate 301 may be made of metal.

In the case of forming the display substrate 301 using metal, the display substrate 301 may be made of at least one metal selected from among the group consisting of iron, chromium, manganese, nickel, titanium, molybdenum, stainless steel (SUS), Invar alloy, Inconel alloy, and Kovar alloy, but is not limited thereto.

The display substrate 301 may include a buffer layer 311. The buffer layer 311 provides a flat surface and blocks foreign matter or moisture from penetrating therethrough. For example, the buffer layer 311 may include an inorganic substance such as silicon oxide, silicon nitride, silicon oxynitride, aluminum oxide, aluminum nitride, titanium oxide, and titanium nitride, or an organic substance such as polyimide, polyester, and acrylic. Alternatively, the buffer layer 311 may be formed as a multi-laminate of the exemplified substances.

A thin-film transistor (TFT) may include an active layer 310, a gate electrode 320, a source electrode 330a, and a drain electrode 330b.

Hereinafter, a case where a TFT is a top gate type in which the active layer 310, the gate electrode 320, the source electrode 330a, and the drain electrode 330b are sequentially formed will be described. However, the present embodiment is not limited thereto, and various types of TFTs such as a bottom gate TFT may be employed.

The active layer 310 may include a semiconductor material, such as amorphous silicon and polycrystalline silicon. However, the present embodiment is not limited thereto, and the active layer 310 may include various materials. As an alternative embodiment, the active layer 310 may include an organic semiconductor material or the like.

As another alternative embodiment, the active layer 310 may include an oxide semiconductor material. For example, the active layer 310 may include an oxide of a metal element selected from Groups 12, 13, and 14 elements such as zinc (Zn), indium (In), gallium (Ga), tin (Sn), cadmium (Cd), and germanium (Ge), and a combination thereof.

A gate insulating layer 313 is formed on the active layer 310. The gate insulating layer 313 serves to isolate the active layer 310 and the gate electrode 320. The gate insulating layer 313 may be formed as a multilayer or a single layer of a film made of an inorganic substance such as silicon oxide and/or silicon nitride.

The gate electrode 320 is provided on top of the gate insulating layer 313. The gate electrode 320 may be connected to a gate line (not illustrated) applying an on/off signal to the TFT.

The gate electrode 320 may be made of a low-resistivity metal. In consideration of adhesion with an adjacent layer, surface flatness of layers to be stacked, and processability, the gate electrode 320 may be formed as a single layer or a multilayer, which is made of at least one metal selected from among the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

An interlayer insulating film 315 is provided on the gate electrode 320. The interlayer insulating film 315 isolates the source electrode 330a, the drain electrode 330b, and the gate electrode 320.

The interlayer insulating film 315 may be formed as a multilayer or single layer of a film made of an inorganic substance. For example, the inorganic substance may be a metal oxide or a metal nitride. Specifically, the inorganic substance may include silicon dioxide ($SiO_2$), silicon nitrides (SiNx), silicon oxynitride (SiON), aluminum oxide ($Al_2O_3$), titanium dioxide ($TiO_2$), tantalum pentoxide ($Ta_2O_5$), hafnium dioxide ($HfO_2$), or zirconium dioxide ($ZrO_2$).

The source electrode 330a and the drain electrode 330b are provided on the interlayer insulating film 315. The source electrode 330a and the drain electrode 330b may be formed as a multilayer or a single layer, which is made of at least one metal selected from among the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). The source electrode 330a and the drain electrode 330b are electrically connected to a source region and a drain region of the active layer 310, respectively.

A planarization layer 317 is provided on the TFT. The planarization layer 317 is configured to cover the TFT, thereby eliminating a height difference caused by the TFT and planarizing the top surface. The planarization layer 317 may be formed as a single layer or a multilayer of a film made of an organic substance. The organic substance may include a general-purpose polymer such as polymethyl methacrylate (PMMA) and polystyrene (PS); a polymer derivative having a phenol group; an acrylic polymer, an imide-based polymer, an arylether-based polymer, an amide-based polymer, a fluorine-based polymer, a p-xylene-based polymer, a vinyl alcohol-based polymer; and a blend thereof. In addition, the planarization layer 317 may be formed as a multi-laminate of an inorganic insulating layer and an organic insulating layer.

A first electrode 510 is provided on the planarization layer 317. The first electrode 510 may be electrically connected to the TFT. Specifically, the first electrode 510 may be electrically connected to the drain electrode 330b through a contact hole formed in the planarization layer 317. The first electrode 510 may have various shapes, for example, may be patterned in an island layout. A bank layer 400 defining a pixel region may be disposed on the planarization layer 317. The bank layer 400 may include a receiving recess where each of the micro LEDs MLs will be received. The bank layer 400 may include, for example, a first bank layer 410 defining the receiving recess. A height of the first bank layer 410 may be determined by a height and viewing angle of the micro LED ML. A size (width) of the receiving recess may be determined by resolution, pixel density, and the like, of a display device. In an embodiment, the micro LED ML may be greater in height than the first bank layer 410. The receiving recess may have a quadrangular cross-sectional shape. However, the present invention is not limited thereto. For example, the receiving recess may have various cross-sectional shapes, such as polygonal, rectangular, circular, conical, elliptical, and triangular.

The bank layer 400 may further include a second bank layer 420 on top of the first bank layer 410. The first bank layer 410 and the second bank layer 420 have a height difference, and the second bank layer 420 may have a smaller width than the first bank layer 410. A conductive layer 550 may be disposed on top of the second bank layer 420. The conductive layer 550 may be disposed in a direction parallel to a data line or a scan line, and may be electrically connected to a second electrode 530. However, the present invention is not limited thereto. For example, the second bank layer 420 may be omitted, and the conductive layer 550 may be disposed on the first bank layer 410. Alternatively, the second bank layer 420 and the conductive layer 500 may be omitted, and the second electrode 530 may be formed over the entire display substrate 301 such that the second electrode 530 serves as an electrode that pixels P share. The first bank layer 410 and the second bank layer 420 may include a material absorbing at least a part of light, a light reflective material, or a light scattering material. The first bank layer 410 and the second bank layer 420 may include an insulating material that is translucent or opaque to visible light (e.g., light in a wavelength range of 380 to 750 nm).

For example, the first bank layer 410 and the second bank layer 420 may be made of a thermoplastic such as polycarbonate (PC), polyethylene terephthalate (PET), polyethersulfone, polyvinyl butyral, polyphenylene ether, polyamide, polyetherimide, a norbornene system resin, a methacrylic resin, and a cyclic polyolefin system resin; a thermosetting plastic such as an epoxy resin, a phenolic resin, a urethane resin, an acrylic resin, a vinyl ester resin, an imide-based resin, an urethane-based resin, a urea resin, and melamine resin; or an organic insulating substance such as polystyrene, polyacrylonitrile, and polycarbonate, but are not limited thereto.

As another example, the first bank layer 410 and the second bank layer 420 may be made of an inorganic insulating substance such as inorganic oxide or inorganic nitride including $SiO_x$, $SiN_x$, $SiN_xO_y$, $AlO_x$, $TiO_x$, $TaO_x$, or $ZnO_x$, but are not limited thereto. In an embodiment, the first bank layer 410 and the second bank layer 420 may be made of an opaque material such as a black matrix material. The insulating black matrix material may include an organic resin; a resin or a paste including a glass paste and a black pigment; metal particles such as nickel, aluminum, molybdenum, or an alloy thereof; metal oxide particles (e.g., chromium oxide); metal nitride particles (e.g., chromium nitride); or the like. In a modification, the first bank layer 410 and the second bank layer 420 may be a distributed Bragg reflectors (DBRs) having high reflectivity or mirror reflectors made of metal.

The micro LED ML is disposed in the receiving recess. The micro LED ML disposed in the receiving recess may be electrically connected to the first electrode 510.

The micro LED ML emits light having wavelengths of different colors such as red, green, blue, white, and the like. With the micro LED ML, it is possible to realize white light by using a fluorescent material or by combining colored lights. The micro LEDs MLs may be picked up from the growth substrate 101 individually or collectively by the transfer head (not illustrated) according to the embodiment of the present invention, transferred to the display substrate 301, and received in the respective receiving recesses of the display substrate 301.

The micro LED ML includes a p-n diode, the first contact electrode 106 disposed on one side of the p-n diode, and the second contact electrode 107 disposed on the opposite side of the first contact electrode 106. The first contact electrode 106 may be connected to the first electrode 510, and the second contact electrode 107 may be connected to the second electrode 530.

The first electrode 510 may include: a reflective layer made of Ag, Mg, Al, Pt, Pd, Au, Ni, Nd, Ir, Cr, or a compound thereof; and a transparent or translucent electrode layer provided on the reflective layer. The transparent or translucent electrode layer may include at least one selected from among the group consisting of indium tin oxide (ITO), indium zinc oxide (IZO), zinc oxide (ZnO), indium oxide ($In_2O_3$), indium gallium oxide (IGO), and aluminum zinc oxide (AZO).

A passivation layer 520 surrounds the micro LED ML in the receiving recess. The passivation layer 520 covers the receiving recess and the first electrode 510 by filling a space between the bank layer 400 and the micro LED ML. The passivation layer 520 may be made of an organic insulating substance. For example, the passivation layer 520 may be made of acrylic, poly(methyl methacrylate) (PMMA), benzocyclobutene (BCB), polyimide, acrylate, epoxy, polyester, or the like, but is not limited thereto.

The passivation layer 520 is formed to have a height not covering a top portion of the micro LED ML, for example, a height not covering the second contact electrode 107, such that the second contact electrode 107 is exposed. The second electrode 530 electrically connected to the exposed second contact electrode 107 of the micro LED ML may be formed on top of the passivation layer 520.

The second electrode 530 may be disposed on the micro LED ML and the passivation layer 520. The second electrode 530 may be made of a transparent conductive material such as ITO, IZO, ZnO, $In_2O_3$, or the like.

In the foregoing description, a vertical micro LED ML in which the first and second contact electrodes 106 and 107 are provided on top and bottom surfaces thereof, respectively, has been described as an example. However, in exemplary embodiments of the present invention, a flip-type or lateral-type micro LED ML in which both the first and second contact electrodes 106 and 107 are provided on one of top and bottom surfaces thereof may be used. In this case, the first and second electrodes 510 and 530 may also be appropriately provided.

First Embodiment

Figure 3:
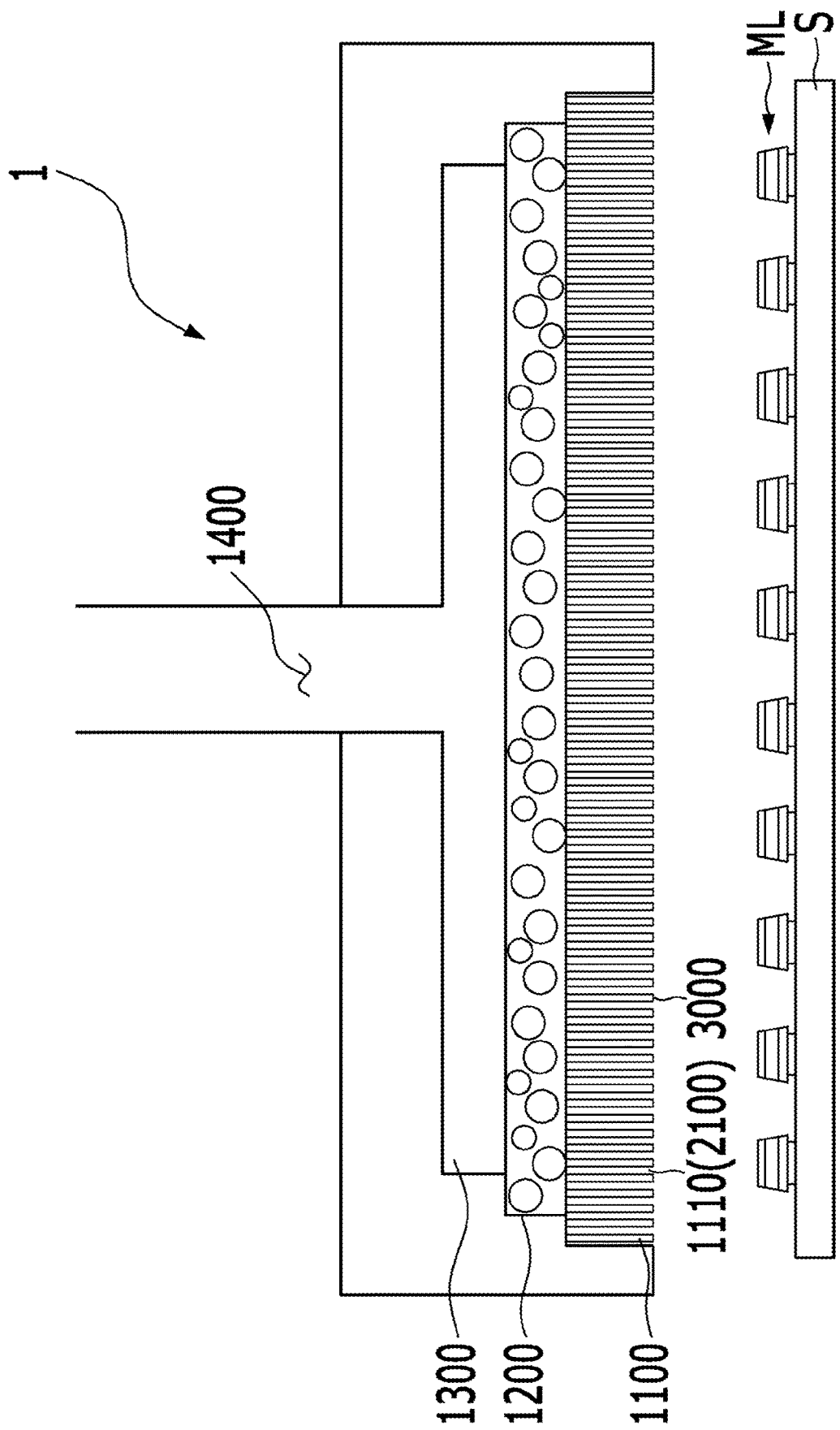
FIG. 3 is a view illustrating a micro LED transfer head according to a technology underlying a first embodiment of the present invention.
Figure 4:
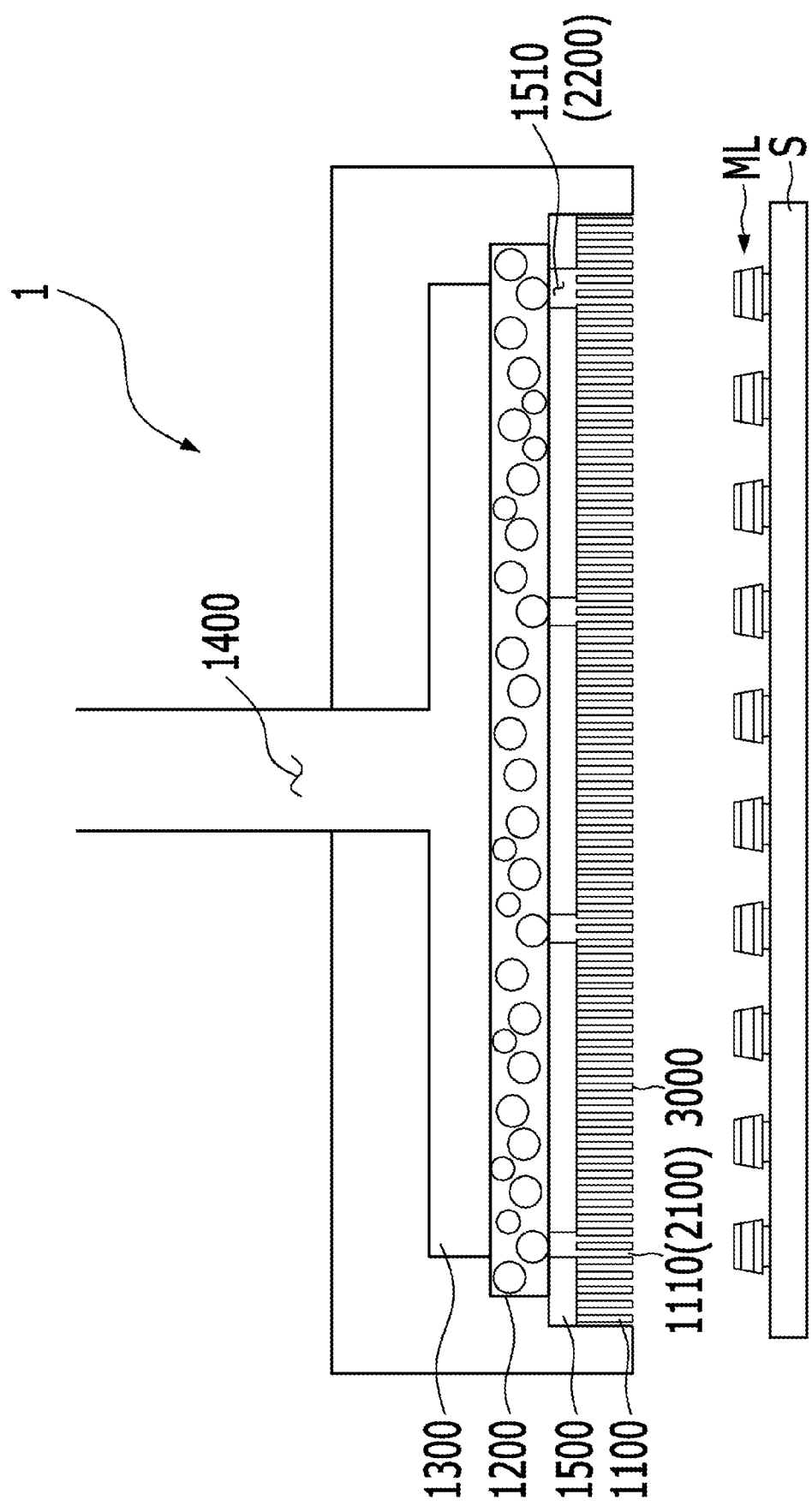
FIG. 4 is a view illustrating a micro LED transfer head according to the first embodiment of the present invention.

FIG. 3 is a view illustrating a micro LED transfer head according to a technology underlying a first embodiment of the present invention, and FIG. 4 is a view illustrating a micro LED transfer head according to the first embodiment of the present invention.

A micro LED transfer head 1 is a holding body, which includes a holding member 1100 and a porous member 1200 and is configured to apply a vacuum to the holding member 1100 and the porous member 1200 or release the applied vacuum to transfer a plurality of micro LEDs MLs from a first substrate (e.g., a growth substrate 101 or a temporary substrate) to a second substrate (e.g., the temporary substrate or a display substrate 301).

A vacuum chamber 1300 is provided on top of the porous member 1200. The vacuum chamber 1300 is connected to a vacuum port providing or releasing a vacuum. The vacuum chamber 1300 functions to apply a vacuum to the porous member 1200 and the holding member 1100 through a suction pipe 1400 or release the applied vacuum in response to the operation of the vacuum port. A structure of engaging the vacuum chamber 1300 with the porous member 1200 is not limited as long as the structure is suitable for preventing gas or air from leaking to other parts when applying a vacuum to the porous member 1200 or releasing the applied vacuum.

Each of the holding member 1100 and the porous member 1200 may include a material including a large number of pores therein and may be configured as a powder, a thin film, a thick film, or a bulk form which has a porosity of about 0.2 to 0.95 in a predetermined arrangement or disordered pore structure. The pores of the holding member 1100 and the porous member 1200 may be classified according to pore sizes thereof into: micropores having a pore diameter of equal to or less than 2 nm; mesopores having a pore diameter of 2 to 50 nm; and macropores having a pore diameter of equal to or greater than 50 nm, and may include at least some of micropores, mesopores, and macropores. Porous materials of the holding member 1100 and the porous member 1200 may be classified according to constituent components thereof into: an organic, an inorganic (ceramic), a metal, or a hybrid type. The holding member 1100 and the porous member 1200 may be configured as a powder, a coating film, or a bulk form. The powder may have various shapes such as a sphere, a hollow sphere, a fiber, and a tube. The powder may be used as it is in some cases, but it is also possible to use a coating film or a bulk form prepared with the powder as a starting material.

The holding member 1100 and the porous member 1200 may have an arbitrary pore structure or a vertical pore structure. In a case where each thereof has an arbitrary pore structure, each thereof has a plurality of arbitrary pores formed during a manufacturing process such as sintering, foaming, or the like and connected to each other such that interior spaces thereof randomly exist. In this case, the arbitrary pores are connected to each other to form air flow paths connecting the top and bottom of each thereof. Alternatively, in a case where each thereof has a vertical pore structure, a plurality of vertical pores pass through each thereof from top to bottom to form air flow paths. In this case, the vertical pores may be pores formed at the time of manufacturing the member, or pores formed by drilling separate holes after manufacturing the member.

The holding member 1100 and the porous member 1200 may have different porosity characteristics. For example, the holding member 1100 and the porous member 1200 may have different characteristics in the arrangement and size of the pores, materials, and shapes. In the present invention, it will be described as an example that the holding member 1100 has a vertical pore structure, and the porous member 1200 has an arbitrary pore structure.

The porous member 1200 is provided on top of the holding member 1100. In this case, the holding member 1100 may function to vacuum-hold the micro LEDs MLs. The porous member 1200 may disposed between a vacuum chamber 1300 and the holding member 110 to function to transmit a vacuum pressure of the vacuum chamber 1300 to the holding member 1100 and to support the holding member 1100.

The holding member 1100 has vertical pores, and includes a holding region 2000 that holds the micro LEDs MLs with a vacuum holding force and a non-holding region 3000 that does not hold the micro LEDs MLs. Specifically, the holding member 1100 may have a vertical pore structure, and for example, the holding member 1100 may be made of an anodic oxide film. However, the material of the holding member 1100 is not limited thereto, and for example, may be made of sapphire or a wafer such as a silicon wafer.

The anodic oxide film is a film formed by anodizing a metal that is a base metal, and a plurality of pores 1110 are formed in the anodic oxide film in a regular arrangement during anodization. In a case where the base metal is aluminum (Al) or an aluminum alloy, the anodization of the base material forms an anodic oxide film consisting of anodized aluminum ($Al_2O_3$) on a surface of the base material. The anodic oxide film formed as described above is divided into a barrier layer 1120 in which the pores 1110 are not formed and a porous layer in which the pores 1110 are formed. The barrier layer 1120 is positioned on top of the base material, and the porous layer is positioned below the barrier layer 1120. That is, the pores 1110 are formed such that respective top and bottom ends thereof are not open, but rather are closed by the barrier layer 1120.

In a case where a hole other than the pores 1110 is not formed in the holding member 1100, the holding region 2000 of the holding member 1100 may be each of the pores 1110 with the barrier layer 1120 removed. That is, by removing the barrier layer 1120 such that the respective top and bottom ends of the pores 1110 are open, the respective holding regions 2000 may be formed in the holding member 1100.

The holding regions 2000 are regions that hold the micro LEDs MLs in response to application of a vacuum from the suction chamber 1300. Non-holding regions 3000 are regions that receives no vacuum from the vacuum chamber 1300 and thus do not hold the micro LEDs MLs. That is, the holding regions 2000 may be the pores 1110 with the barrier layer 1120 removed, and the non-holding regions 3000 may be pores 1110 with the barrier layer 1120 not removed or pores 1110 with respective top and bottom ends closed by a separate shield (not illustrated).

A size of a horizontal area of each of the holding regions 2000 may be smaller than that of a top surface of each of the micro LEDs MLs. This may ensure that vacuum leakage can be prevented while the micro LED ML is vacuum-held, thereby facilitating vacuum holding.

The porous member 1200 having arbitrary pores is provided on top of the holding member 1100. The porous member 1200 is made of a porous ceramic material, and a plurality of crystalline particles is formed therein. In this case, the crystalline particles formed inside the porous member 1200 may be irregularly formed, and regions excluding the crystalline particles may be pores that transmit a vacuum pressure.

The porous member 1200 that transmits a vacuum supplied from the vacuum chamber 1300 to the holding member 1100 includes a plurality of crystalline particles that are irregularly formed. In this case, the crystalline particles of the porous member 1200 may be provided at a respective positions corresponding to the holding regions 2000 of the holding member 1100. That is, the crystalline particles of the porous member 1200 may block the pores 1110, which are spaces where the holding member 1100 and the porous member 1200 communicate with each other. Accordingly, vacuum holding force of the porous member 1200 is not allowed to be transmitted to the holding member 1100, and the holding member 1100 is not allowed to have the holding force and thus cannot hold the micro LEDS MLs. That is, due to the crystalline particles of the porous member 1200, the micro LED transfer head 1 may have a problem that holding of the micro LEDs MLs becomes impossible.

In order to prevent the above problem, a coupling member 1500 is provided on top of the holding member 1100. The coupling member 1500 is provided between the holding member 1100 and the porous member 1200, and has a plurality of holding holes 1510 formed therein. In this case, the pores 1110 of the holding member 1100 are formed in a form in which the respective top and bottom ends thereof are open with the barrier layer 1120 removed, and each of the pores 1110 may provide a first holding region 2100. Each of the holding holes 1510 may provide a second holding region 2200.

The coupling member 1500 may be made of photoresist (PR, including dry film PR). However, the material of the coupling member 1500 is not limited thereto, as long as the material that allows easy formation of a plurality of holes.

The second holding region 2200 is provided above the first holding region 2100 and may be formed to have a larger opening area than the first holding region 2100. Specifically, the second holding region 2200 may be large in opening area than the first holding region 2100 provided by each of the pores 1110 of the holding member 1100.

Further, the second holding region 2200 may be formed to communicate with the first holding region 2100. That is, the second holding region 2200 and the first holding region 2100 may be positioned to be coaxially aligned with each other. Accordingly, vacuum holding force transmitted from the porous member 1200 may be sequentially provided to the second holding region 2200 and the first holding region 2100.

Due to the fact that the coupling member 1500 including the second holding region 2200 having a larger opening area than the first holding region 2100 is provided between the holding member 1100 and the porous member 1200, even if the crystalline particles of the porous member 1200 are provided at positions blocking the first holding region 2100, the crystalline particles of the porous member 1200 may be prevented from interfering with the transfer of the micro LEDs MLs due to the second holding region 2200 interposed between the first holding region 2100 and the porous member 1200.

Further, due to the fact that the coupling member 1500 is provided between the porous member 1200 and the holding member 1100, the coupling member 1500 may support loads of the porous member 1200 and the vacuum chamber 1300 to prevent deformation of the holding member 1100.

Second Embodiment

Figure 5:
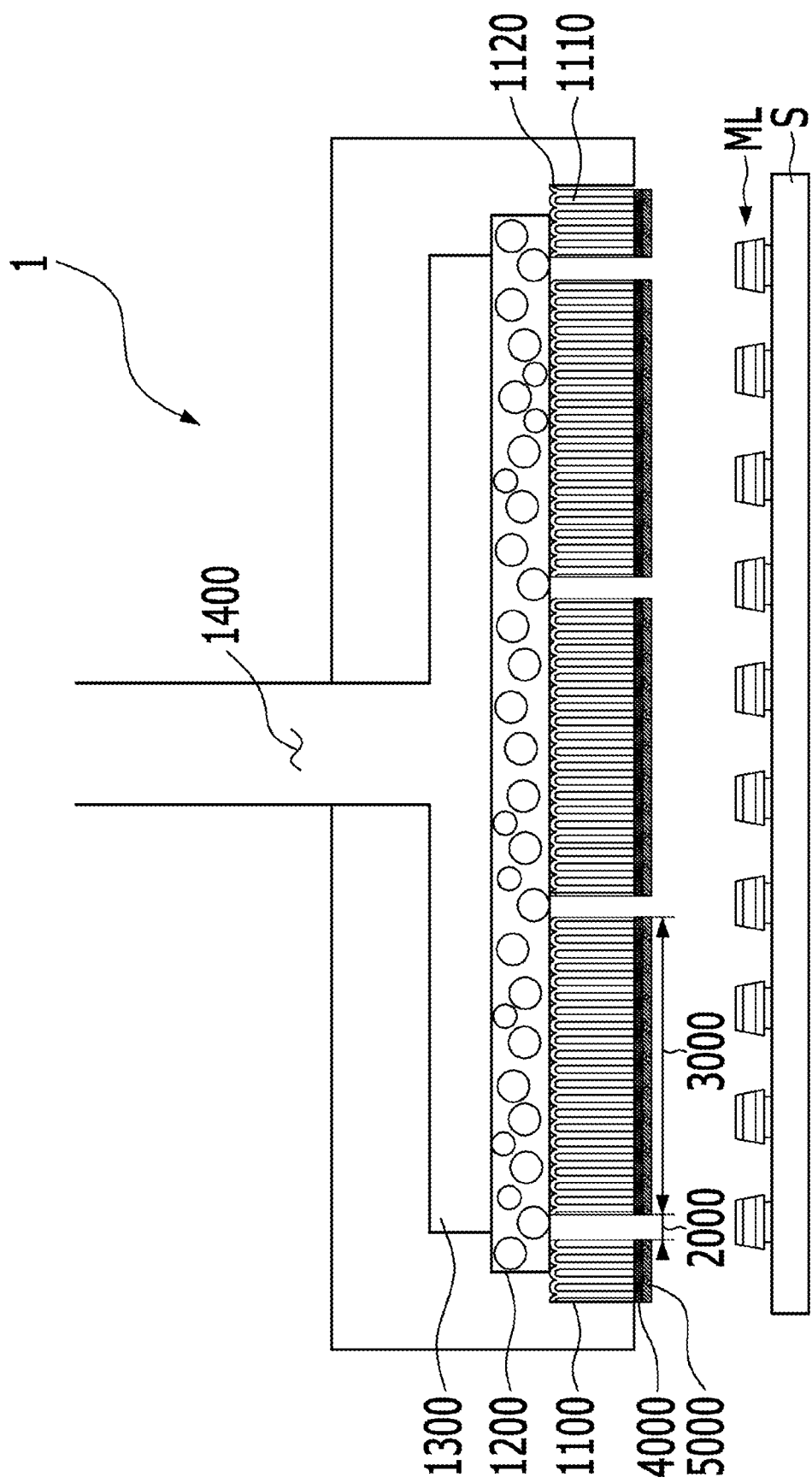
FIG. 5 is a view illustrating a micro LED transfer head according to a technology underlying a second embodiment of the present invention.
Figure 6:
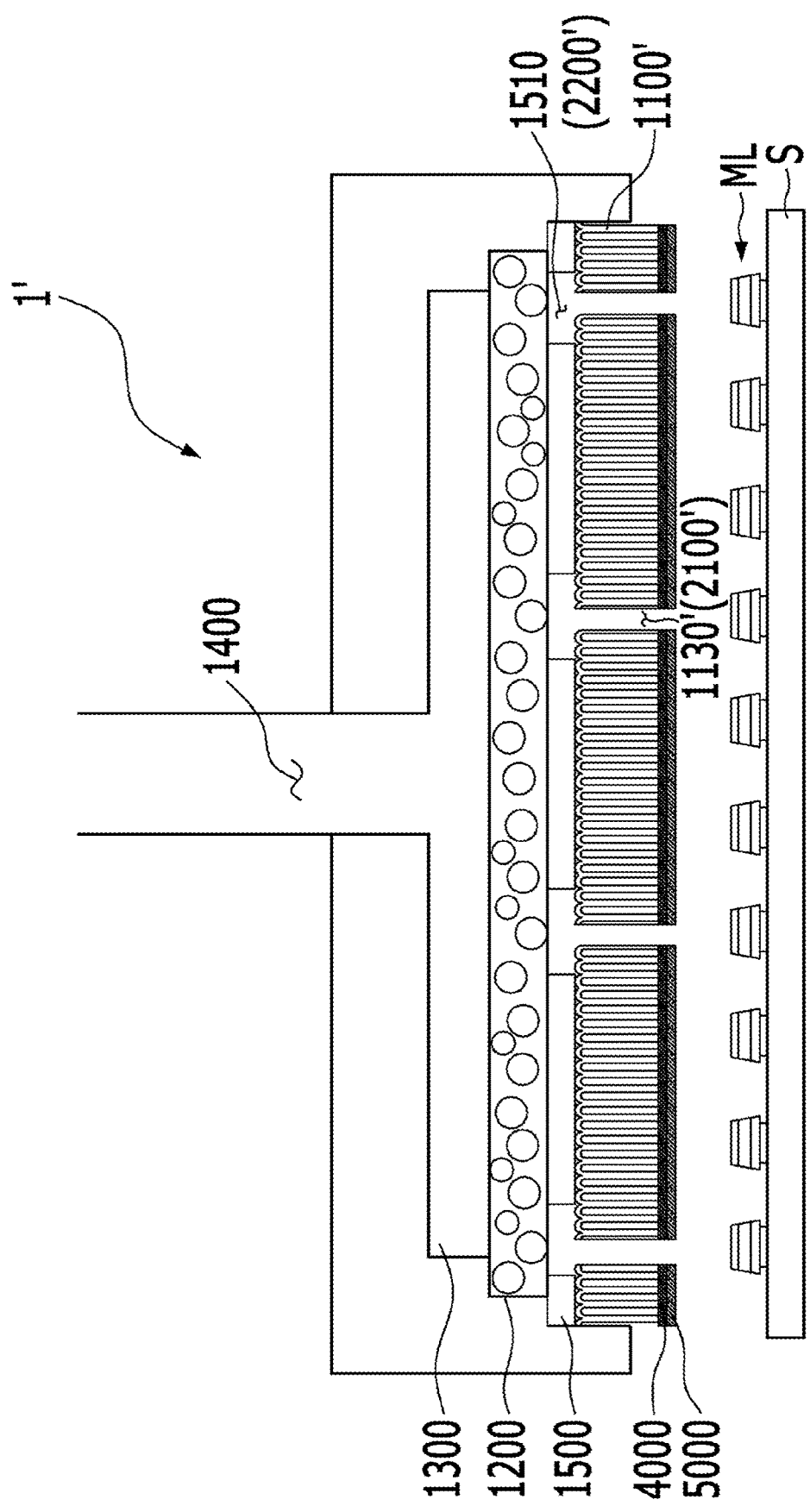
FIG. 6 is a view illustrating a micro LED transfer head according to the second embodiment of the present invention.
Figure 7:
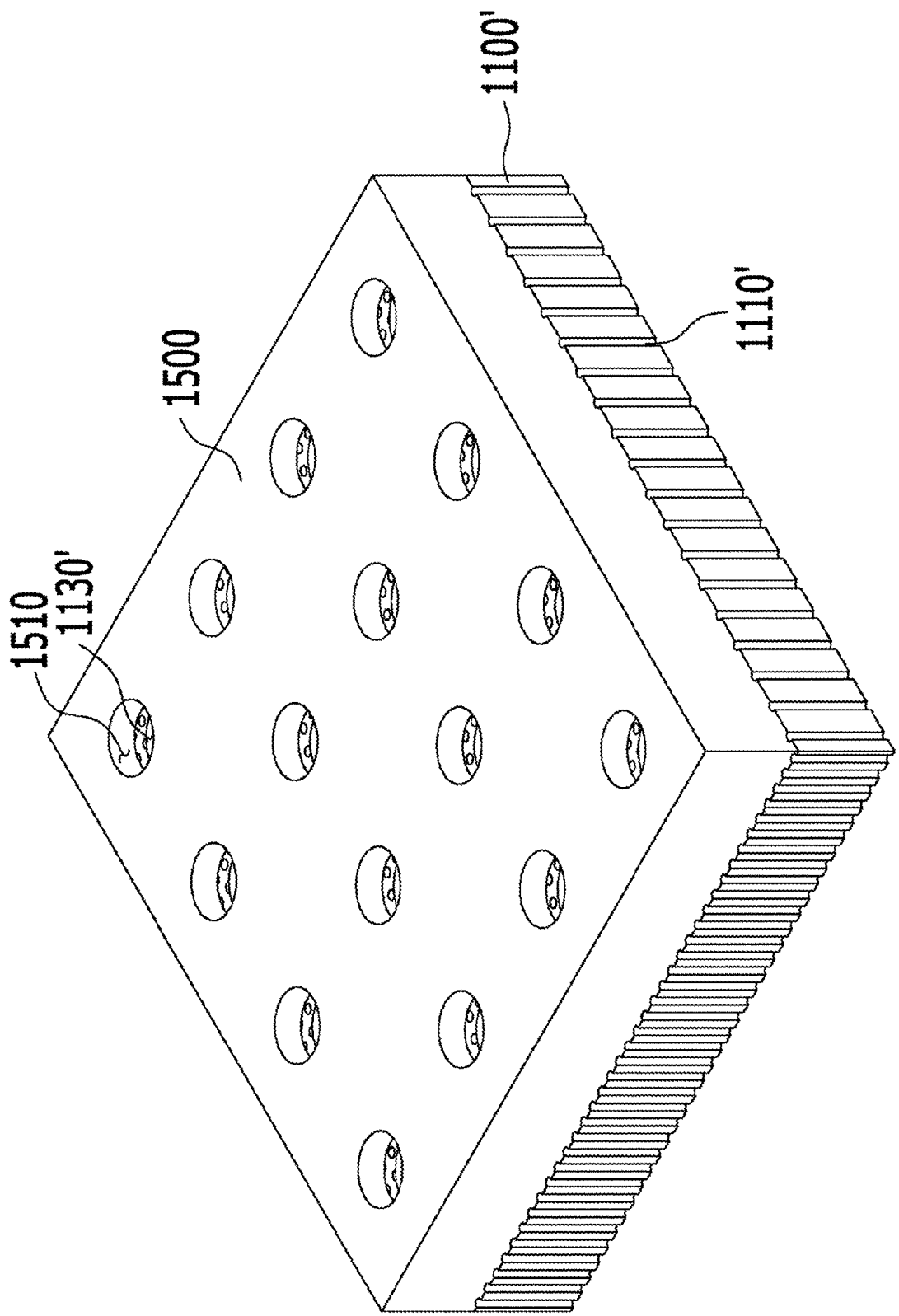
FIG. 7 is a perspective view illustrating a holding member and a coupling member illustrated in FIG. 6.
Figure 8:
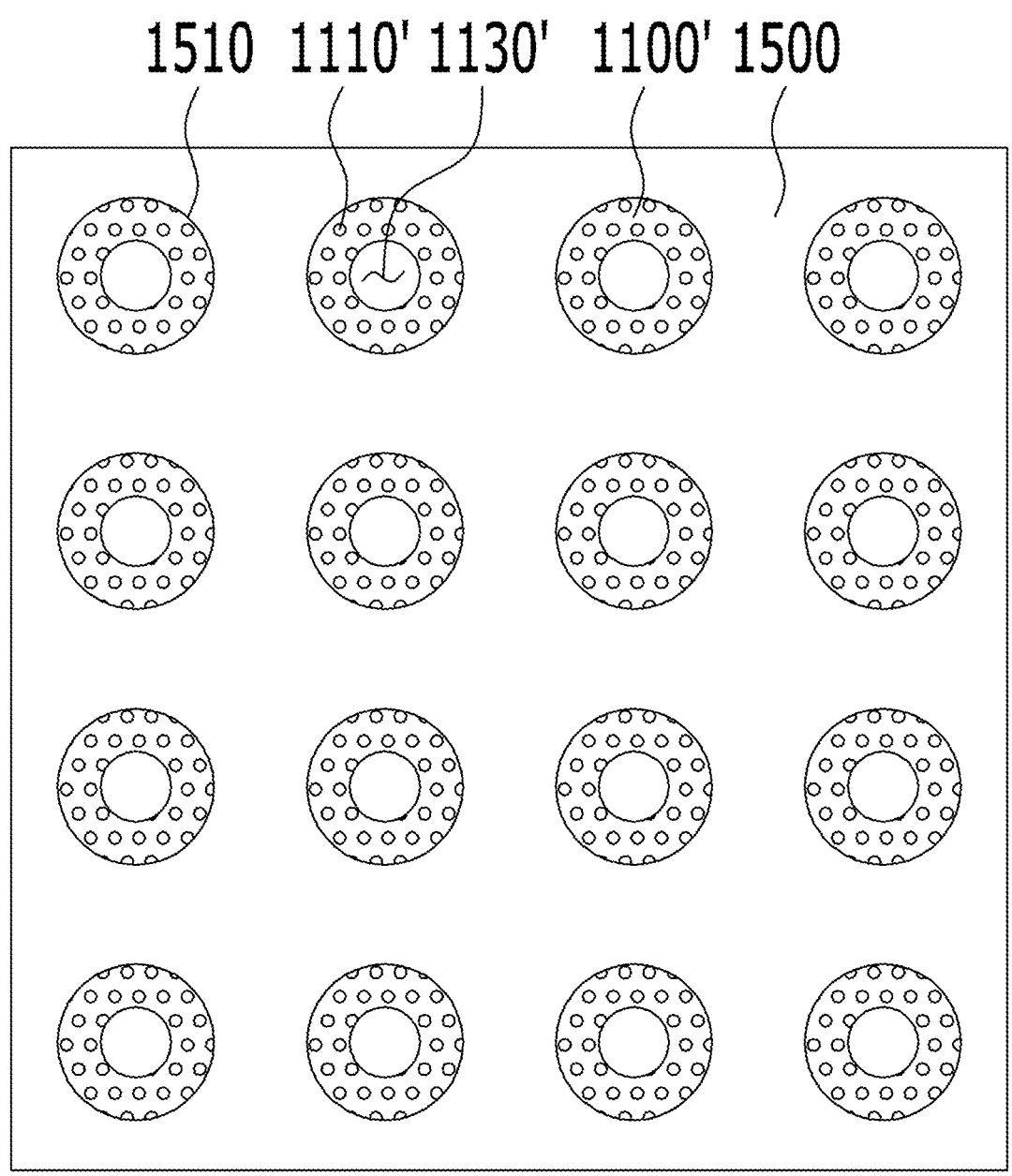
FIG. 8 is a plan view of FIG. 7.

FIG. 5 is a view illustrating a micro LED transfer head according to a technology underlying a second embodiment of the present invention, FIG. 6 is a view illustrating a micro LED transfer head according to the second embodiment of the present invention, FIG. 7 is a perspective view illustrating a holding member and a coupling member illustrated in FIG. 6, and FIG. 8 is a plan view of FIG. 7. Since there is a difference between the second embodiment and the first embodiment only in that a through-hole 1130' is further provided in a holding member 1100', the difference will be mainly described and the same parts employ the description and reference numerals of the first embodiment.

Referring to FIGS. 5 to 8, a holding member 1100' includes the through-hole 1130' having a larger width than each pore 1110'. In this case, a first holding region 2100' may be provided by each of the respective through-holes 1130', and a non-holding region 3000 may be provided by a remaining region excluding the through-holes 1130'.

The holding member 1100' may be provided with a buffer part 4000. The buffer part 4000 is provided on a holding surface of the holding member 1100' on which a plurality of micro LEDs MLs is held, and may be provided in a form surrounding the respective first holding regions 2100'. The buffer part 4000 may be made of an elastic material. This may ensure that damage to the micro LEDs MLs that may occur due to contact between the holding member 1100' and the micro LEDs MLs can be prevented.

A metal part 5000 may be provided below the buffer part 4000. In other words, the metal part 5000 may be formed to have the same area as the buffer part 4000. The metal part 5000 may be made of a metal material. This may ensure that electrostatic force that interferes with a micro LED ML transfer process can be effectively removed in advance.

As illustrated in FIG. 5, in a case where a porous member 1200 including a plurality of crystalline particles is provided on top of the holding member 1100', the crystalline particles may block the through-holes 1130', which are the first holding regions 2100'. Accordingly, vacuum holding force of the porous member 1200 is not allowed to be transmitted through the through-holes 1130', and thus the holding member 1100' is not allowed to have the holding force and thus cannot hold the micro LEDs MLs.

In order to prevent the above problem, a coupling member 1500 is provided between the holding member 1100' and the porous member 1200. The coupling member 1500 is provided on a top surface of the non-holding region 3000, and may have a plurality of holding holes 1510 each of which has a larger width than each of the through-holes 1130'. In this case, each of the plurality of holding holes 1510 may provide a second holding region 2200'.

The first holding regions 2100' and each of the second holding regions 2200' may be coaxially positioned such that the respective centers thereof are positioned on the same vertical line. That is, the first holding region 2100 and the second holding region 2200 may be positioned to be coaxially aligned with each other. Accordingly, the second holding regions 2200' each of which has a larger width than each of the first holding regions 2100' may be formed as air flow paths between the first holding region 2100' and the porous member 1200. This may ensure that holding force for holding the micro LEDs MLs can be prevented from being lowered due to the crystalline particles of the porous member 1200 that block the first holding regions 2100'.

Further, due to the fact that the through-holes 1130' each of which has a larger width than the pore 1110' are formed in the holding member 1100' and provide the first holding regions 2100', holding force greater than holding force transmitted through the pores 1110' may be provided to the micro LEDs MLs. That is, the holding member 1100' can efficiently hold the micro LEDs MLs through the through-holes 1130'.

Third Embodiment

Figure 9:
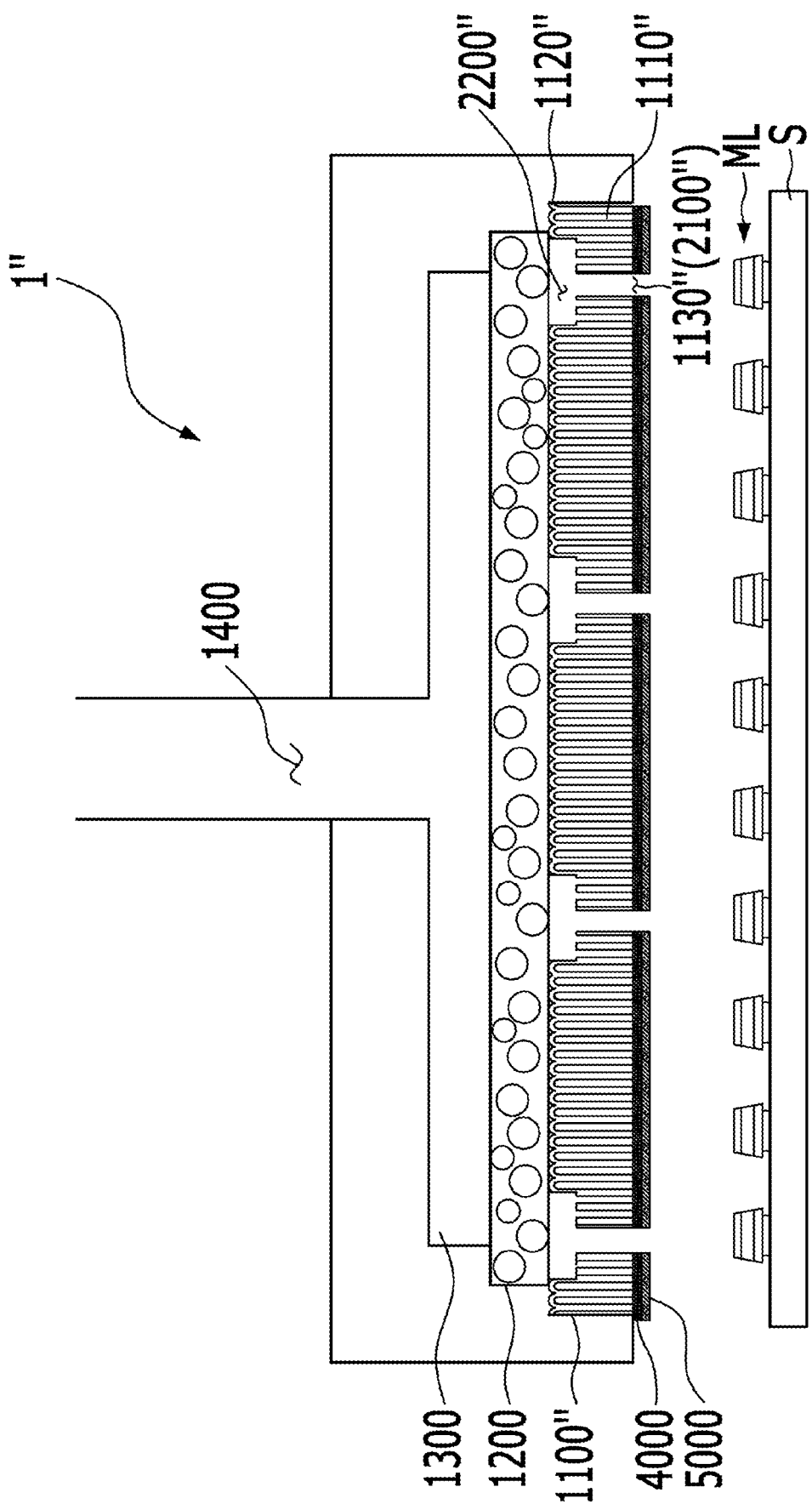
FIG. 9 is a view illustrating a micro LED transfer head according to a third embodiment of the present invention.

FIG. 9 is a view illustrating a micro LED transfer head according to a third embodiment of the present invention. Since there is a difference between the third embodiment and the second embodiment only in the shape of a holding member 1100" and in that provision of a coupling member 1500 is eliminated, the difference will be mainly described and the same parts employ the description and reference numerals of the second embodiment.

Referring to FIG. 9, the holding member 1100" includes a through-hole 1130" having a larger width than each pore 1110". Each of the respective through-holes 1130" may provide a first holding region 2100", and a second holding region 2200" may be formed by removing a portion of the holding member 1100". Specifically, a predetermined portion of the periphery of each of the through-holes 1130" may be removed from the holding member 1100". That is, a plurality of second holding regions 2200" may be formed in the holding member 1100", and each of the second holding region 2200" may have a larger opening area than each of the respective first holding regions 2100". As described above, the first holding regions 2100" are formed to extend from an intermediate portion to a bottom surface of the holding member 1100" and the second holding regions 2200" are formed to extend from a top surface to the intermediate portion of the holding member 1100" such that the first and second holding regions 2100" and 2200" are connected to each other and each of the second holding regions 2200" has a larger opening area than each of the first holding regions 2100".

Each of the first holding regions 2100" may be formed to have a circular cross-section, and each of the second holding regions 2200" may be formed to have a larger diameter than the first holding region 2100" at a position coaxial with the first holding region 2100". Accordingly, vacuum holding force transmitted to the porous member 1200 from a vacuum chamber 1300 may be sequentially provided to the first holding region 2100" through the second holding region 2200".

In this embodiment, due to the fact that provision of the coupling member between the holding member 1100" and the porous member 1200 is eliminated, and that a gap is formed between the holding member 1100" and the porous member 1200 by removing a portion of the holding member 1100", a micro LED transfer head 1" can efficiently hold the micro LEDs MLs without requiring provision of a separate configuration.

Fourth Embodiment

Figure 10:
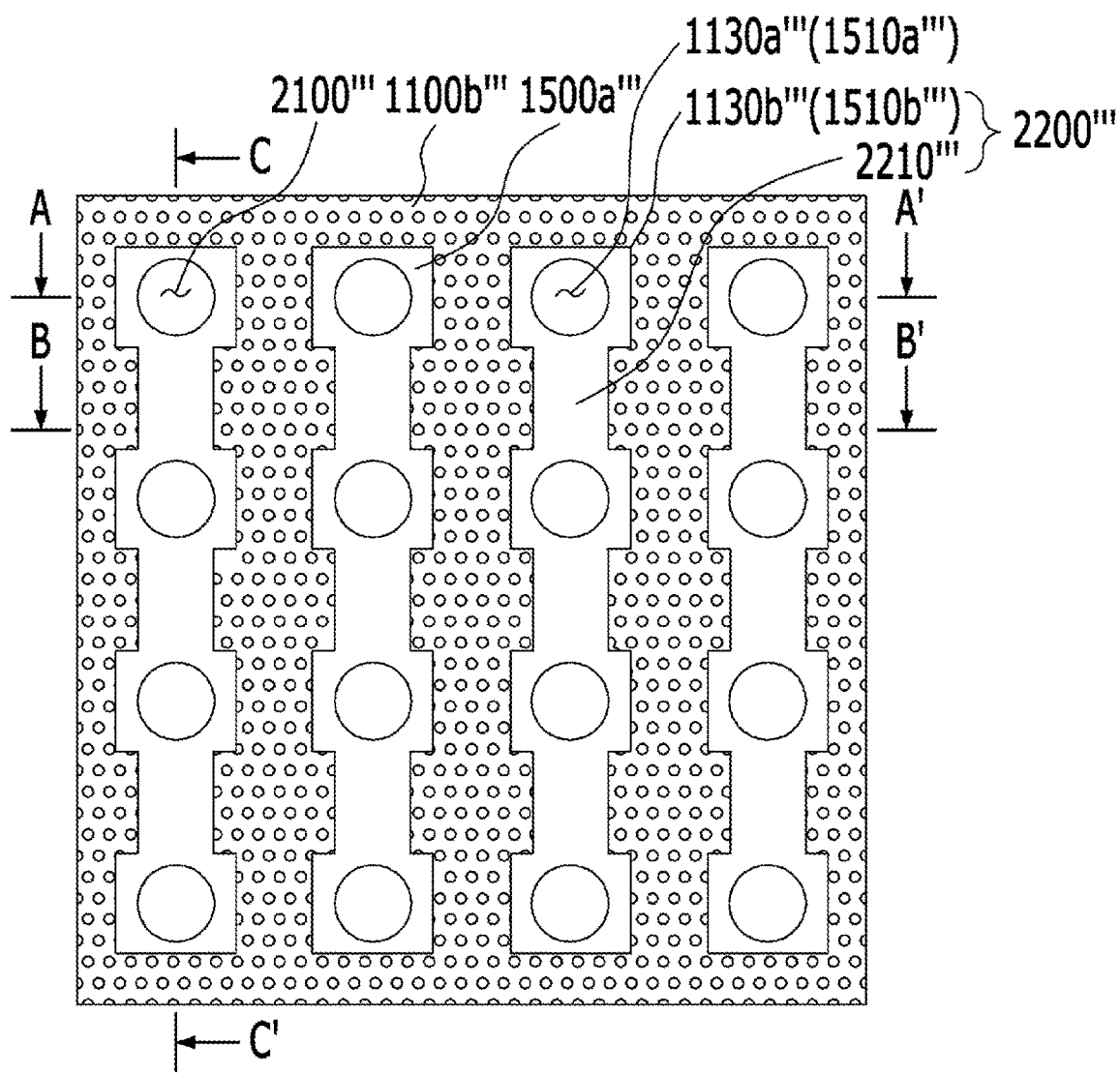
FIG. 10 is a plan view illustrating a holding member and a coupling member of a micro LED transfer head according to a fourth embodiment of the present invention.
Figure 11:
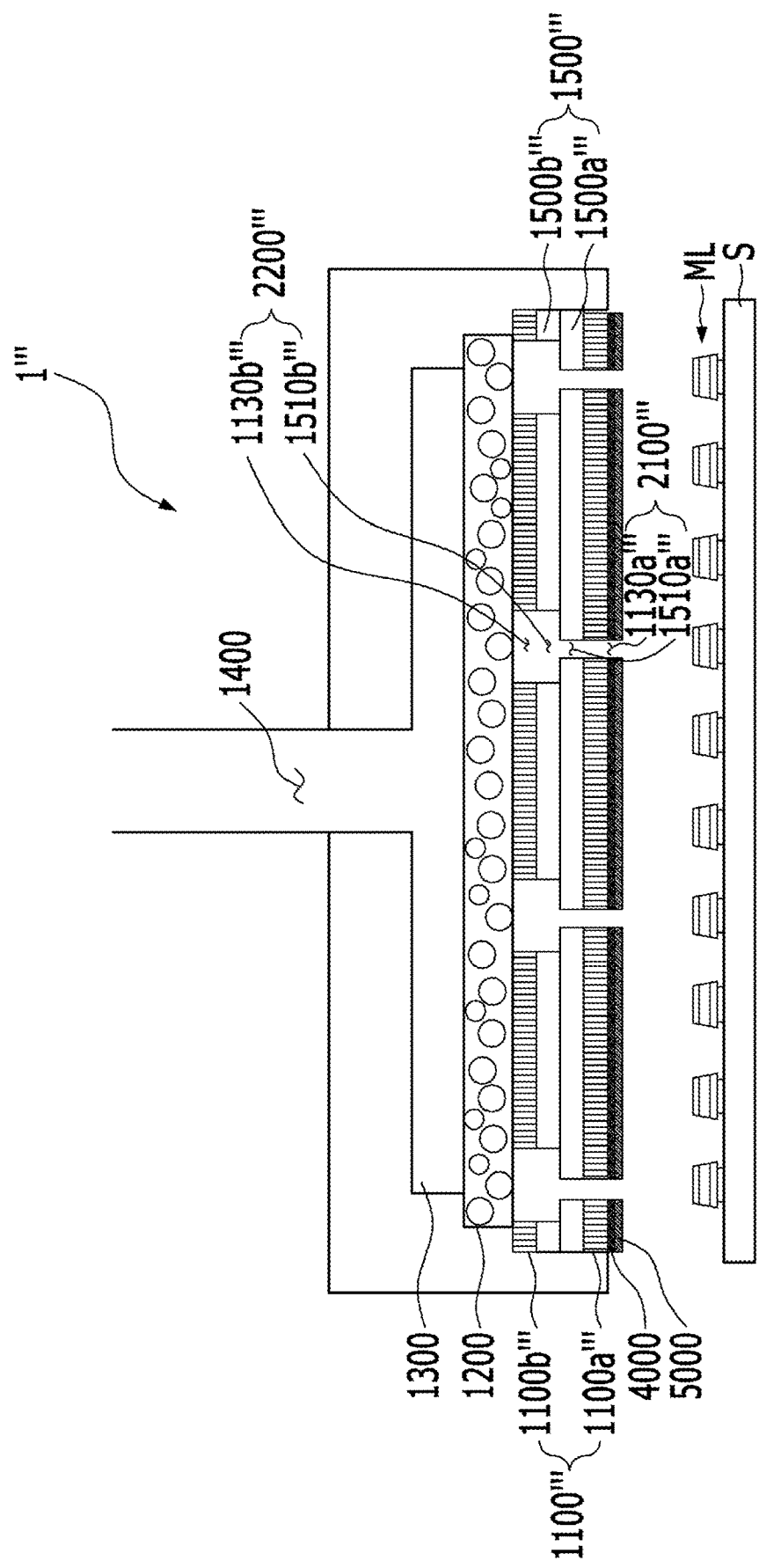
FIG. 11 is a view illustrating the micro LED transfer head including the holding member and the coupling member cut along line A-A' in FIG. 10.
Figure 12:
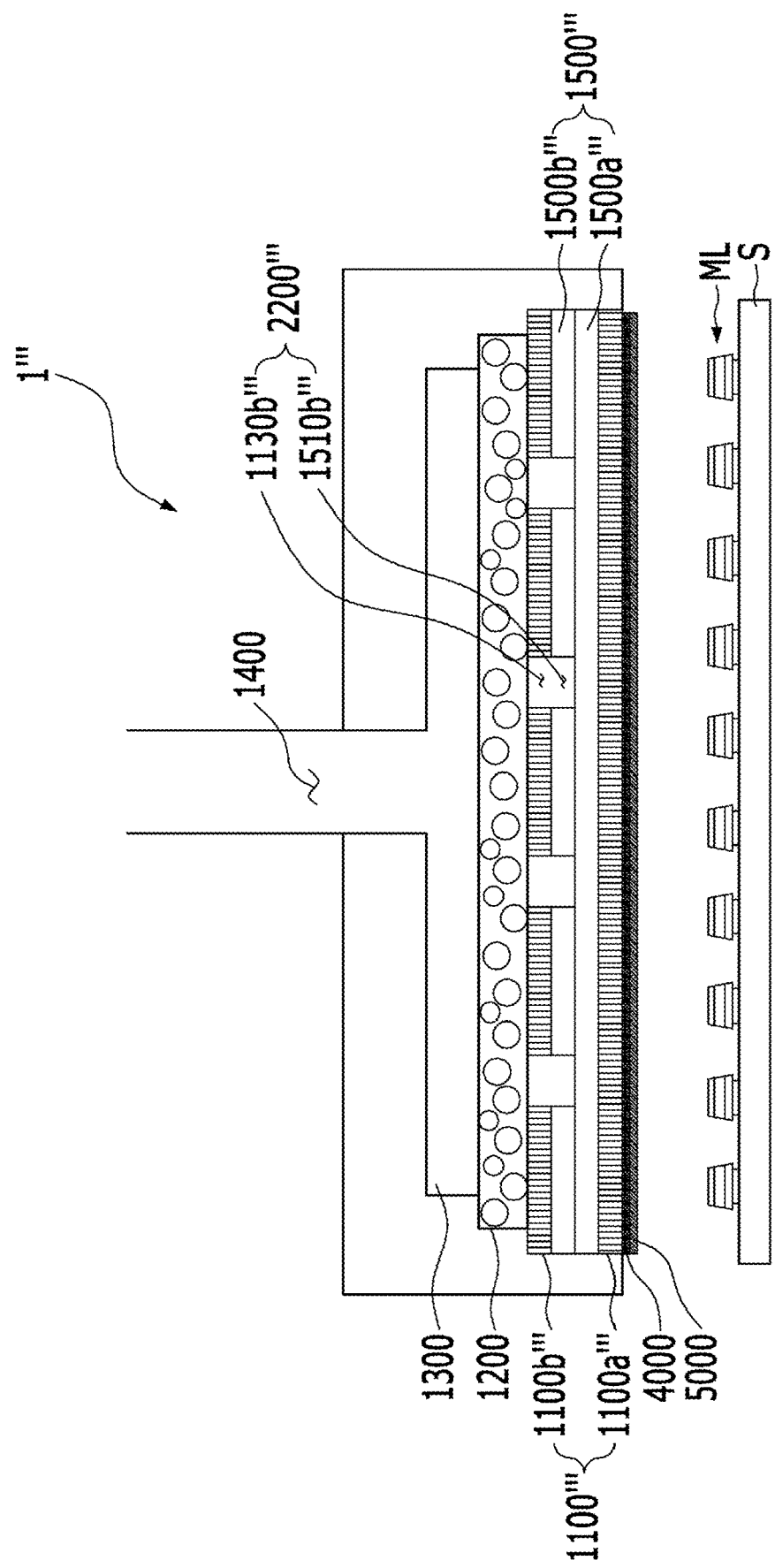
FIG. 12 is a view illustrating the micro LED transfer head including the holding member and the coupling member cut along line B-B' in FIG. 10.
Figure 13:
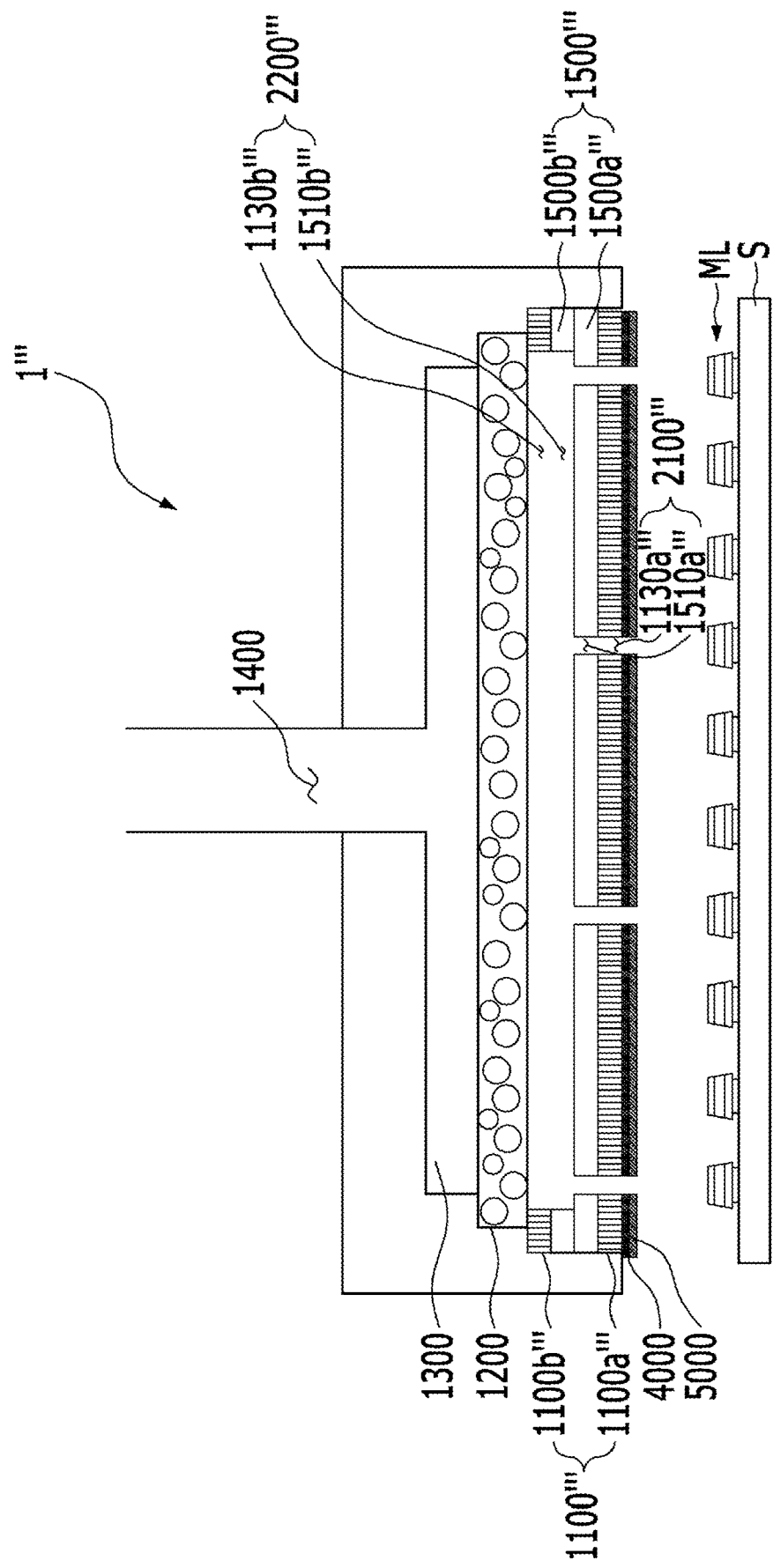
FIG. 13 is a view illustrating the micro LED transfer head including the holding member and the coupling member cut along line C-C' in FIG. 10.
Figure 14:
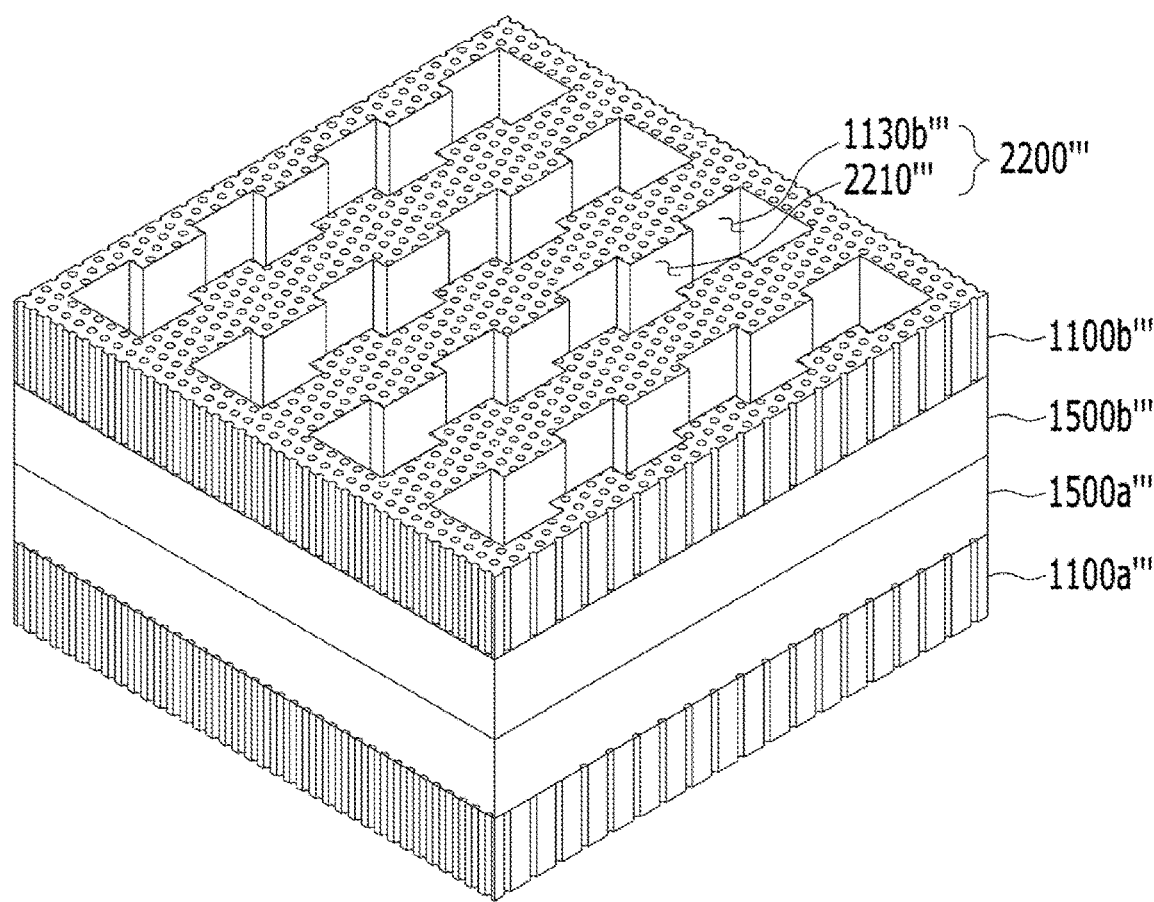
FIG. 14 is a perspective view illustrating the holding member and the coupling member illustrated in FIG. 10.
Figure 15:
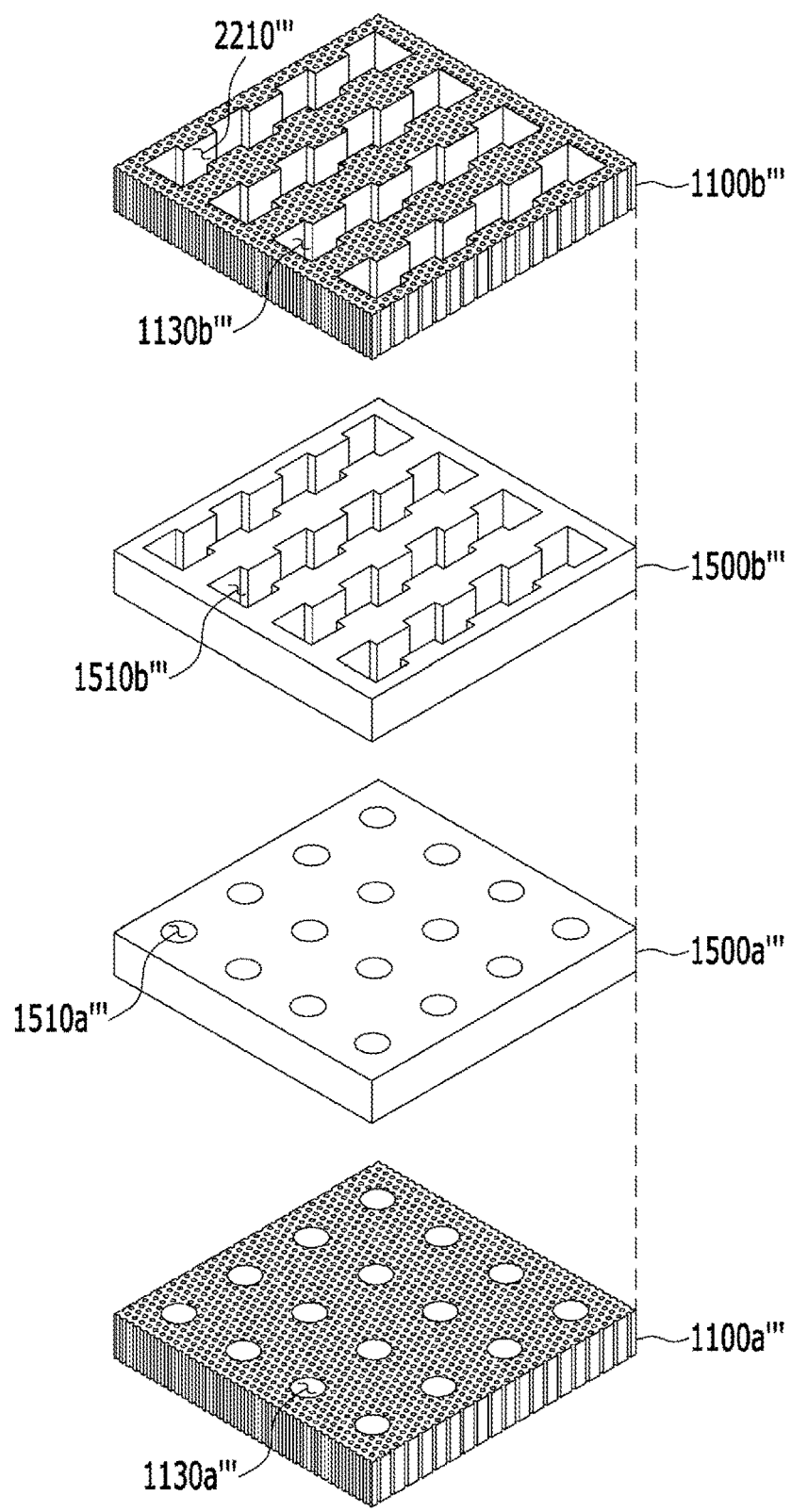
FIG. 15 is an exploded perspective view of FIG. 14.

FIG. 10 is a plan view illustrating a holding member and a coupling member of a micro LED transfer head according to a fourth embodiment of the present invention, FIG. 11 is a view illustrating the micro LED transfer head including the holding member and the coupling member cut along line A-A' in FIG. 10, FIG. 12 is a view illustrating the micro LED transfer head including the holding member and the coupling member cut along line B-B' in FIG. 10, FIG. 13 is a view illustrating the micro LED transfer head including the holding member and the coupling member cut along line C-C' in FIG. 10, FIG. 14 is a perspective view illustrating the holding member and the coupling member illustrated in FIG. 10, and FIG. 15 is an exploded perspective view of FIG. 14. Since there is a difference between the fourth embodiment and the second embodiment only in that a holding member 1100''' and a coupling member 1500''' are provided in a double structure, the difference will be mainly described and the same parts employ the description and reference numerals of the second embodiment.

Referring to FIGS. 10 to 15, the holding member 1100''' of the micro LED transfer head 1" includes a first holding member 1100a''', and a second holding member 1100b''' provided on top of the first holding member 1100a'''. Further, the coupling member 1500''' includes a first coupling member 1500a''' and a second coupling member 1500b'''. In this case, the coupling member 1500''' may be provided between the first holding member 1100a''' and the second holding member 1100b'''.

Specifically, the first holding member 1100a''' and the first coupling member 1500a''' may be coupled to each other such that corresponding holes thereof are coaxially aligned with each other, and the second holding member 1100b''' and the second coupling member 1500b''' may be coupled to each other such that corresponding holes thereof are coaxially aligned with each other. Further, the first holding member 1100a''' and the second holding member 1100b''' may be coupled to each other such that corresponding holes thereof are coaxially aligned with each other. That is, the first holding member 1100a''' may be provided at the bottom, the first coupling member 1500a''' may be provided on top of the first holding member 1100a''' such that the corresponding holes thereof are coaxially aligned with each other, the second coupling member 1500b''' may be provided on top of the first coupling member 1500a''' such that the corresponding holes thereof are coaxially aligned with each other, and the second holding member 1100b''' may be provided on top of the second coupling member 1500b''' such that the corresponding holes thereof are coaxially aligned with each other. In this case, the first coupling member 1500a''' and the second coupling member 1500b''' may be made of the same material, for example, photoresist, and may be joined by means of thermal compression.

A plurality of first through-holes 1130a''' may be formed in the first holding member 1100a''', and a plurality of first holding holes 1510a''' each of which has the same size and shape as each of the first through-holes 1130a''' of the first holding member 1100a''' may be formed in the first coupling member 1500a'''. Further, a plurality of second through-holes 1130b''' may be formed in the second holding member 1100b''', and a plurality of second holding holes 1510b''' each of which has the same size and shape as each of the second through-holes 1130b''' of the second holding member 1100b''' may be formed in the second coupling member 1500b'''.

The first through-holes 1130a''' and the second through-holes 1130b''' may be formed in different sizes and shapes. For example, each of the first through-holes 1130a''' and each of the first holding holes 1510a''' may be formed to have circular cross-sections, and each of the second through-holes 1130b''' and the second holding holes 1510b''' may be formed to have a quadrangular cross-section. In addition, the second through-hole 1130b''' and the second holding hole 1510b''' may be formed to have a larger size than the first through-hole 1130a''' and the first holding hole 1510a'''.

The plurality of first through-holes 1130a''' and the plurality of the first holding holes 1510a''' may be independently formed in the first holding member 1100a''' and the first coupling member 1500a''', respectively. That is, the respective first through-holes 1130a''' are formed not to communicate with each other, and the respective first holding holes 1510a''' are formed not to communicate with each other.

Meanwhile, the plurality of second through-holes 1130b''' and the second holding holes 1510b''' are independently formed in the second holding member 1100b''' and the second coupling member 1500b''', respectively, and a connection passage 2210''' may be formed to be connected to at least a part of the second through-holes 1130b'''. A connection passage 2210''' may also be formed to be connected to at least a part of the second holding holes 1510b'''. The connection passage 2210''' connects adjacent second through-holes 1130b''' to each other to allow the adjacent second through-holes 1130b''' to communicate with each other, and may be formed between the adjacent second through-holes 1130b'''. Similarly, the connection passage 2210''' connects adjacent second holding holes 1510b''' to each other to allow the adjacent second holding holes 1510b''' to communicate with each other, and may be formed between the adjacent second holding holes 1510b'''. For example, in the second holding member 1100b''', second through-holes 1130b''' formed in the same row or column may communicate with each other through connection passages 2210'''. Similarly, in the second coupling member 1500b''', second holding holes 1510b''' formed in the same row or column may communicate with each other through connection passages 2210'''.

A first holding region 2100''' may include each of the first through-hole 1130a''' and a corresponding one of the first holding holes 1510a''' and may be formed in a vertical communication structure in which the first through-hole 1130a''' and the first holding hole 1510a''' communicate with each other. A second holding region 2200''' may include each of the second through-holes 1130b''', a corresponding one of the second holding holes 1510b''', and respective connection passages 2210''' connected to the second through-hole 1130b''' and the second holding hole 1510b''' and may be formed in a vertical communication structure in which the second through-hole 1130b''', the second holding hole 1510b''', and the connection passages 2210''' communicate with each other. That is, a plurality of first holding regions 2100''' may be formed independently of each other, and a plurality of second holding regions 2200''' may be formed such that at least parts thereof communicate with each other.

Each of the first holding regions 2100''' may be formed to have a circular cross-section, and each of the second through-holes 1130b''' and the second holding holes 1510b''' may be formed to have a quadrangular cross-section. In addition, in the second coupling member 1500b''', the second through-holes 1130b''' formed in the same column may communicate with each other through the connection passages 2210'''. Similarly, in the second holding member 1100b''', the second holding holes 1510b''' formed in the same column may communicate with each other through the connection passages 2210'''. For example, as illustrated in FIG. 15, in the second holding member 1100b''', the second through-holes 1130b''' in the same column may communicate with each other while the second through-holes 1130b''' in the same row may not communicate with each other. Similarly, in the second coupling member 1500b''', the second holding holes 1510b''' in the same column may communicate with each other while the second holding holes 1510b''' in the same row may not communicate with each other.

The vacuum holding force is transmitted from the porous member 1200 through the second holding regions 2200''' to the first holding regions 2100'''. Each of the second holding regions 2200''' is formed to have a larger opening area than each of the first holding regions 2100''', so that even if crystalline particles of the porous member 1200 are provided at positions blocking the first holding regions 2100''', the porous member 1200 and the first holding regions 2100''' may communicate with each other through the second holding regions 2200'''.

In this embodiment, it has been described as an example that the first through-holes 1130a''' and the first holding-holes 1510a''' are formed to have a smaller size than the second through-holes 1130b''' and the second holding holes 1510b'''. However, the present invention is not limited thereto, and the first through-holes 1130a''' and the first holding-holes 1510a''' may be formed to have the same size as the second through-holes 1130b''' and the second holding holes 1510b'''. Specifically, even if the first through-holes 1130a''' and the first holding-holes 1510a''' have the same size as the second through-holes 1130b''' and the second holding holes 1510b''', due to the fact that at least parts of the second through-holes 1130b''' are formed to communicate with each other and at least parts of the second holding holes 1510b''' are formed to communicate with each other, the first holding regions 2100''' and the second holding regions 2200''' may be formed to have different sizes. That is, even if the first through-holes 1130a''' and the first holding-holes 1510a''' have the same size as the second through-holes 1130b''' and the second holding holes 1510b''', due to the fact that each of the second holding regions 2200''' further includes the connection passage 2210'', the second holding regions 2200''' may be formed to be larger than the first holding regions 2100'''. Accordingly, the vacuum holding force can be efficiently transmitted from the porous member 1200 to the first holding regions 2100''' through the second holding regions 2200'''.

Figure 16A:
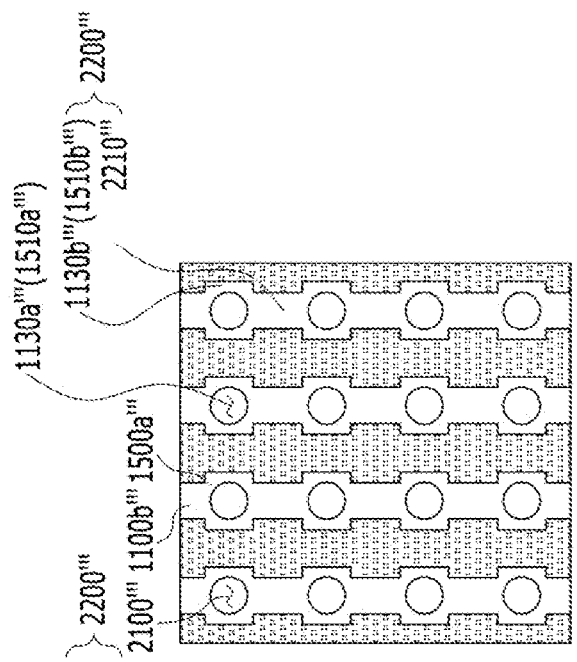
FIGS. 16A, 16B, and 16C are views illustrating modifications of the fourth embodiment.

FIG. 16A is a view illustrating a first modification of the fourth embodiment.

Referring to FIG. 16A, each adjacent second through-holes 1130b''' may be connected to each other by a connection passage 2210''' to communicate with each other therethrough, and each adjacent second holding-holes 1510b''' may be connected to each other by a connection passage 2210''' to communicate with each other therethrough. That is, all the second through-holes 1130b''' may be connected to each other to communicate with each other and all the second holding-holes 1510b''' may be connected to each other to communicate with each other, and the second through-holes 1130b'' and the second holding-holes 1510b''' may communicate with each other by a vertical communication structure. Thus, one second holding region 2200'' may be commonly formed in a second holding member 1100b''' and a second coupling member 1500b'''.

The vacuum holding force transmitted from a porous member 1200 to one second holding region 2200''' may be divided into a plurality of individual forces and transmitted to the plurality of first holding regions 2100''' to hold a plurality of micro LEDs MLs.

Figure 16B:
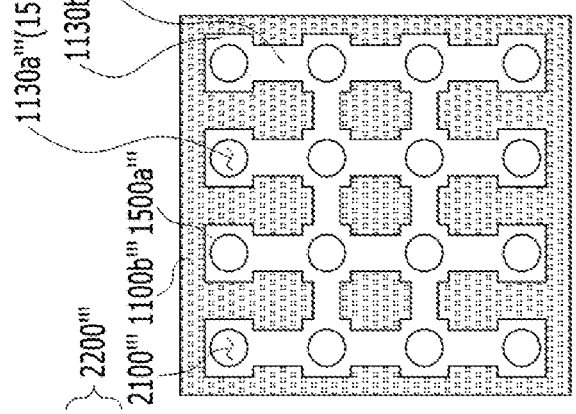

FIG. 16B is a view illustrating a second modification of the fourth embodiment.

Referring to FIG. 16B, in a second holding member 1100b''', second through-holes 1130b''' positioned in the same column may be connected to each other by connection passages 2210''' to communicate with each other therethrough, while second through-holes 1130b''' positioned in the same row may be configured such that at least parts thereof are connected to each other by connection passages 2210''' to communicate with each other therethrough. Similarly, in a second coupling member 1500b''', second holding holes 1510b''' positioned in the same column may be connected to each other by a connection passage 2210''' to communicate with each other therethrough, while second holding holes 1510b''' positioned in the same row may be configured such that at least parts thereof are connected to each other by connection passages 2210''' to communicate with each other therethrough. For example, second through-holes 1130b''' positioned in first and fourth rows may not be connected to each other, while second through-holes 1130b''' positioned in second and third rows may be connected to each other by connection passages 2210''' to communicate with each other therethrough. Similarly, second holding holes 1510b''' positioned in first and fourth rows may not be connected to each other, while second holding holes 1510b''' positioned in second and third rows may be connected to each other by connection passages 2210''' to communicate with each other therethrough. However, the positions of the connection passages 2210''' are not limited thereto. For example, the connection passages 2210''' may be provided between the second through-holes 1130b''' positioned in first and fourth rows rather than second and third rows to connect the second through-holes 1130b''' to each other, and may be provided between the second holding holes 1510b''' positioned in first and fourth rows rather than second and third rows to connect the second through-holes 1130b''' to each other.

Figure 16C:
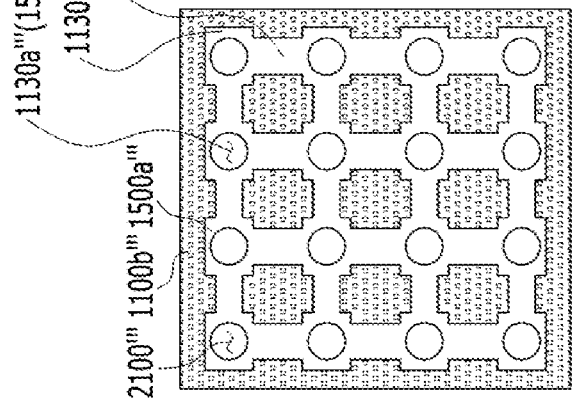

FIG. 16C is a view illustrating a third modification of the fourth embodiment.

Referring to FIG. 16C, in a second holding member 1100b''', second through-holes 1130b''' positioned in the same column may be connected to each other by connection passages 2210''' to communicate with each other therethrough. Similarly, in a second coupling member 1500b''', second holding holes 1510b''' positioned in the same column may be connected to each other by connection passages 2210''' to communicate with each other therethrough. In this case, in the second holding member 1100b''', a connection passage 2210''' connected to each outer second through-hole 1130b''' may be further formed by extending from the second through-hole 1130b''' to a first or second end of the second holding member 1100b'''. Similarly, in the second coupling member 1500b''', a connection passage 2210''' connected to each outer second holding hole 1510b may be further formed by extending from the second holding hole 1510b to a first or second end of the second coupling member 1500b'''. Accordingly, a plurality of second holding regions 2200''' may be formed in a form in which a part of the second holding regions 2200''' positioned in each column forms an array of second holding regions 2200''' and respective arrays of second holding regions 2200''' are arranged in the direction of row to pass through the second holding member 1100b''' and the second coupling member 1500b'''. In this embodiment, it is illustrated that all the arrays of second holding regions 2200''' positioned in four rows are formed to pass through the second holding member 1100b''' and the second coupling member 1500b'''. However, the shapes of the second holding member 1100b''' and the second coupling member 1500b''' are not limited thereto, and only a part of the arrays of second holding regions 2200''' may be formed to pass through the second holding member 1100b''' and the second coupling member 1500b'''. For example, among outer second through-holes 1130b''' and outer second holding holes 1510b''', only a part of the outer second through-holes 1130b''' and a part of the outer second holding holes 1510b''' may be connected to connection passages 2210'''.

Further, the second holding member 1100b''' and the second coupling member 1500b''' may be formed such that the arrays of second holding regions 2200''' do not pass through the second holding member 1100b''' and the second coupling member 1500b''' in at least one of the direction of row and the direction of column. Specifically, in a case where the arrays of second holding regions 2200''' pass through the second holding member 1100b''' and the second coupling member 1500b''' in both the direction of row and the direction of column, vacuum holding force transmitted from a porous member 1200 may leak outside. Thus, by forming the arrays of second holding regions 2200''' so as not to pass through the second holding member 1100b''' and the second coupling member 1500b''' in at least one of the direction of row and the direction of column, it is possible to prevent vacuum holding force from leaking outside.

While exemplary embodiments of the micro LED transfer head according to the present invention have been described above, the embodiments are only examples of the invention, and it will be understood by those skilled in the art that various modifications, additions and substitutions are possible, without departing from the scope and spirit of the invention as disclosed in the accompanying claims. Therefore, the scope of the invention should be determined on the basis of the descriptions in the appended claims, and all equivalents thereof should belong to the scope of the invention.

What is claimed is:

1. A micro LED transfer head, comprising:
   a holding member including a holding region that holds a micro LED by means of vacuum holding force and a non-holding region that does not hold the micro LED; and
   a porous member provided on top of the holding member and having arbitrary pores,
   wherein the holding region comprises:
   a first holding region; and
   a second holding region provided above the first holding region, formed to have a larger opening area than the first holding region, and communicating with the first holding region and the porous member, whereby the micro LED transfer head selectively transfers the micro LED.

2. The micro LED transfer head of claim 1, further comprising:
   a coupling member provided between the holding member and the porous member, and provided on a top surface of the non-holding region,
   wherein the second holding region comprises a plurality of second holding regions formed in the coupling member.

3. The micro LED transfer head of claim 2, wherein the holding member is made of an anodic oxide film having vertical pores, and the first holding region is provided by each of the vertical pores formed such that top and bottom ends of the vertical pore are open by removing a barrier layer formed during production of the anodic oxide film.

4. The micro LED transfer head of claim 2, wherein the holding member is made of an anodic oxide film having vertical pores, and the first holding region is provided by a through-hole formed such that top and bottom ends thereof are open, and having a larger width than each of the vertical pores formed during production of the anodic oxide film.

5. The micro LED transfer head of claim 1, wherein the holding member is made of an anodic oxide film having vertical pores, and the second holding region is formed by removing a part of a barrier layer formed during production of the anodic oxide film.

6. A micro LED transfer head, comprising:
   a holding member including a holding region that holds a micro LED by means of vacuum holding force and a non-holding region that does not hold the micro LED; and
   a porous member provided on top of the holding member and having arbitrary pores,
   wherein the holding member comprises:
   a first holding member; and
   a second holding member provided on top of the first holding member and coupled to the porous member,
   wherein a first coupling member is coupled to top of the first holding member such that corresponding holes thereof are coaxially aligned with each other, a second coupling member is coupled to bottom of the second holding member coupling member such that corresponding holes thereof are coaxially aligned with each other, and the first holding member and the second holding member are coupled to each other such that corresponding holes thereof are coaxially aligned with each other; and
   a first holding region is formed in the first holding member and the first coupling member, and a second holding region is formed in the second holding member and the second coupling member.

7. The micro LED transfer head of claim 6, wherein the first holding region formed in the first holding member and the first coupling member comprises a plurality of first holding regions that are formed independently of each other, and
   the second holding region formed in the second holding member and the second coupling member comprises a plurality of second holding regions that are formed such that at least parts thereof communicate with each other.

8. The micro LED transfer head of claim 6, wherein the second holding region has a larger opening area than the first holding region, and the second holding region communicates with the porous member.

\* \* \* \* \*